US009263687B2

(12) United States Patent
Tanaka et al.

(10) Patent No.: US 9,263,687 B2
(45) Date of Patent: Feb. 16, 2016

(54) ORGANIC MOLECULAR MEMORY

(71) Applicant: Kabushiki Kaisha Toshiba, Minato-ku (JP)

(72) Inventors: Yusuke Tanaka, Kawasaki (JP); Hideyuki Nishizawa, Toshima (JP); Shigeki Hattori, Kawasaki (JP); Koji Asakawa, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/456,159

(22) Filed: Aug. 11, 2014

(65) Prior Publication Data

US 2015/0083988 A1 Mar. 26, 2015

(30) Foreign Application Priority Data

Sep. 24, 2013 (JP) ................. 2013-196983

(51) Int. Cl.
*H01L 51/30* (2006.01)
*H01L 51/05* (2006.01)
*G11C 13/00* (2006.01)
*H01L 51/00* (2006.01)

(52) U.S. Cl.
CPC ........ *H01L 51/0595* (2013.01); *G11C 13/0014* (2013.01); *H01L 51/0034* (2013.01); *H01L 51/0051* (2013.01); *H01L 51/0098* (2013.01)

(58) Field of Classification Search
CPC ......... H01L 51/0034; G11C 13/0014
See application file for complete search history.

(56) References Cited

U.S. PATENT DOCUMENTS

2002/0105897 A1 8/2002 McCreery
2004/0007758 A1 1/2004 McCreery (Continued)

FOREIGN PATENT DOCUMENTS

JP 2004-537422 12/2004
JP 2005-244236 9/2005

(Continued)

OTHER PUBLICATIONS

J. Chen et al."Room-temperature negative differential resistance in nanoscale molecular junctions", Applied Physics Letters, vol. 77, No. 8, 2000, 4 pages.

(Continued)

*Primary Examiner* — Evan Pert
(74) *Attorney, Agent, or Firm* — Oblon, McClelland, Maier & Neustadt, L.L.P.

(57) ABSTRACT

An organic molecular memory in an embodiment includes a first conducive layer, a second conductive layer, and an organic molecular layer provided between the first conductive layer and the second conductive layer, the organic molecular layer having an organic molecule, the organic molecule having a linker group bonded to the first conductive layer, a π conjugated chain bonded to the linker group, and a phenyl group bonded to the π conjugated chain opposite to the linker group and facing the second conductive layer, the π conjugated chain including electron-accepting groups or electron-donating groups arranged in line asymmetry with respect to a bonding direction of the π conjugated chain, the phenyl group having substituents R0, R1, R2, R3, and R4 as shown in the following formula, the substituent R0 being an electron-accepting group or an electron-donating group.

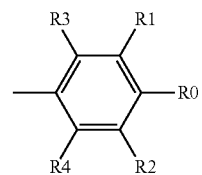

20 Claims, 21 Drawing Sheets

(56) References Cited

U.S. PATENT DOCUMENTS

| | | |
|---|---|---|
| 2004/0165806 A1 | 8/2004 | Zhou et al. |
| 2006/0060836 A1 | 3/2006 | Zhang et al. |
| 2006/0208252 A1 | 9/2006 | Wessels et al. |
| 2008/0087887 A1 | 4/2008 | Cho et al. |
| 2008/0138635 A1 | 6/2008 | Chen et al. |
| 2008/0224131 A1 | 9/2008 | Zhang et al. |
| 2012/0241713 A1 | 9/2012 | Nishizawa et al. |
| 2014/0008601 A1 | 1/2014 | Nishizawa et al. |

FOREIGN PATENT DOCUMENTS

| | | |
|---|---|---|
| JP | 2006-245549 | 9/2006 |
| JP | 2008-103708 | 5/2008 |
| JP | 2008-513543 | 5/2008 |
| JP | 2008-514032 | 5/2008 |
| JP | 2008-532310 | 8/2008 |
| JP | 2012-204433 | 10/2012 |
| JP | 2012-204434 | 10/2012 |

OTHER PUBLICATIONS

Dustin K. James et al. "Electrical Measurements in Molecular Electronics", Chem. Mater., vol. 16, No. 23, 2004, 13 pages.

Andrei Honciuc et al. "Current Rectification in a Langmuir-Schaefer Monolayer of Fullerene-bis-[4-diphenylamino -4"-($N$-ethyl-$N$-2'''-ethyl) amino-1,4-diphenyl-1,3-butadiene] Malonate between Au Electrodes", J. Phys. Chem B, vol. 109, No. 2, 2005, 15 pages.

ORGANIC MOLECULAR MEMORY

CROSS-REFERENCE TO RELATED APPLICATION

This application is based upon and claims the benefit of priority from Japanese Patent Application No. 2013-196983, filed on Sep. 24, 2013, the entire contents of which are incorporated herein by reference.

FIELD

Embodiments described herein relate generally to organic molecular memories.

BACKGROUND

As mobile devices such as portable electronic devices have become widely used, flash memories have been widely used as large-capacitance inexpensive nonvolatile memories that can hold stored data even when power is off. However, in recent years, the limits in miniaturization of flash memories have come into view, and nonvolatile memories such as a magnetic random access memory (MRAM), a phase change random access memory (PCRAM), a conductive bridging random access memory (CBRAM), and a resistance random access memory (ReRAM) have been developed actively.

For example, when ReRAMs are used, a memory cell array can be configured only by stacking variable resistive elements and rectifying elements, which constitute memory cells, at intersections between word lines and bit lines. This allows the construction of a high-density memory system. Further, when memory cell arrays having such a structure are used, memory cell arrays can be stacked in layers into a three-dimensional structure, thus allowing a higher density.

Generally, for ReRAMs, a metal oxide is used as a variable resistive element, and a PIN diode or the like is used as a rectifying element. In order to achieve a higher density, it is necessary to make a memory cell itself smaller.

As one approach to make a memory cell itself smaller, there is a possible method of using organic molecules for a variable resistive element and a rectifying element. According to this method, an organic molecule itself is small in size, and thus allows an element to be reduced in size.

As for a rectifying element of organic molecules, there is a report on rectification by an element with a molecule D-σ-A, in which insulating covalent bonds bridge an electron-donating group (donor group) D with a small ionization potential and an electron-accepting group (acceptor group) A with a high electron affinity, sandwiched between electrodes. Further, there is a report on rectification by an element with a molecule T-D-π-A, in which a bridging portion is replaced with a short π electron and an insulating alkyl chain T (tail) is bonded to D, sandwiched between electrodes.

A donor group D tends to release an electron, and thus tends to accept a hole but does not accept an electron. Thus, a hole flows from an electrode to D, but an electron does not. On the other hand, an acceptor group A tends to accept an electron but does not tend to release an electron, and does not constitute a hole. Thus, an electron flows from an electrode to A, but a hole does not. Thus, a current flows only in a direction from D to A, developing rectification.

On the other hand, for a variable resistive element of organic molecules, there is a report that a self-assembled monolayer of molecules each having an acceptor nitro group and a donor amino group on a phenylene ethynylene skeleton exhibits a negative differential resistance, and develops a memory property that the ON/OFF ratio (the ratio of a current flowing when the same voltage is applied before switching to that after switching) is 1000 or greater.

As described above, there are some examples of reports on an organic molecule to which a donor or acceptor substituent is attached develops rectification and a memory effect. However, there are points to be kept in mind to design a memory cell.

In a ReRAM, a variable resistive element and a rectifying element are connected in series because of its cell structure. Therefore, when the value of a current flowing through a memory cell is low while a variable resistive element is in a low resistance state, a share of voltage applied to the variable resistance element becomes small, thus resulting in an increase in operating voltage. Therefore, the resistance value of the rectifying element in a forward bias direction needs to be sufficiently smaller than the resistance value of the variable resistive element in the low resistance state.

Further, in order to increase the reliability of a cell when reading a signal, it is more preferable for a variable resistive element to have a larger difference between a resistance value in a low resistance state and that in a high resistance state. In other words, it is preferable that the ON/OFF ratio of a variable resistive element be large.

It is not easy to design a molecular device, taking the above points into account. Further, it is difficult to design a molecular device so that a single organic molecule is provided with both a rectifying property and a memory property, taking the above points into account. Thus, there is a room for improvement in the design of an organic molecule for use in a memory cell.

DETAILED DESCRIPTION

An organic molecular memory in an embodiment includes a first conducive layer, a second conductive layer, and an organic molecular layer provided between the first conductive layer and the second conductive layer, the organic molecular layer having an organic molecule, the organic molecule having a linker group bonded to the first conductive layer, a π conjugated chain bonded to the linker group, and a phenyl group bonded to the π conjugated chain opposite to the linker group and facing the second conductive layer, the π conjugated chain having single bonds and double bonds or triple bonds bonded alternately, a carbon number of the π conjugated chain being larger than twelve and not larger than forty six, the π conjugated chain including electron-accepting groups or electron-donating groups arranged in line asymmetry with respect to a bonding direction of the π conjugated chain, the phenyl group having substituents R0, R1, R2, R3, and R4 as shown in the following formula, the substituent R0 being an electron-accepting group or an electron-donating group.

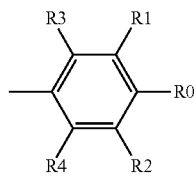

Hereinafter, embodiments of the present disclosure will be described with reference to the drawings. In the following description, identical members and others are denoted by identical reference letters or numerals, and members and others described once will not be described as appropriate.

In the specification, a "resistance variable type molecular chain" means a molecular chain having a function of varying the resistance, depending on the presence or absence of an electric field or a charge injection.

In the specification, a "chemical bond" is an idea indicating one of a covalent bond, an ion bond, and a metal bond, and is an idea excluding a hydrogen bond and a bond by van der Waals force.

First Embodiment

An organic molecular memory in this embodiment includes a first conducive layer, a second conductive layer, and an organic molecular layer provided between the first conductive layer and the second conductive layer, the organic molecular layer having an organic molecule, the organic molecule having a linker group bonded to the first conductive layer, a π conjugated chain bonded to the linker group, and a phenyl group bonded to the π conjugated chain opposite to the linker group and facing the second conductive layer, the π conjugated chain having single bonds and double bonds or triple bonds bonded alternately, a carbon number of the π conjugated chain being larger than twelve and not larger than forty six, the π conjugated chain including electron-accepting groups or electron-donating groups arranged in line asymmetry with respect to a bonding direction of the π conjugated chain, the phenyl group having substituents R0, R1, R2, R3, and R4 as shown in the following formula, the substituent R0 being an electron-accepting group or an electron-donating group.

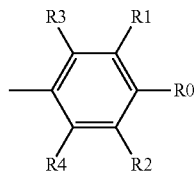

Figure 1:
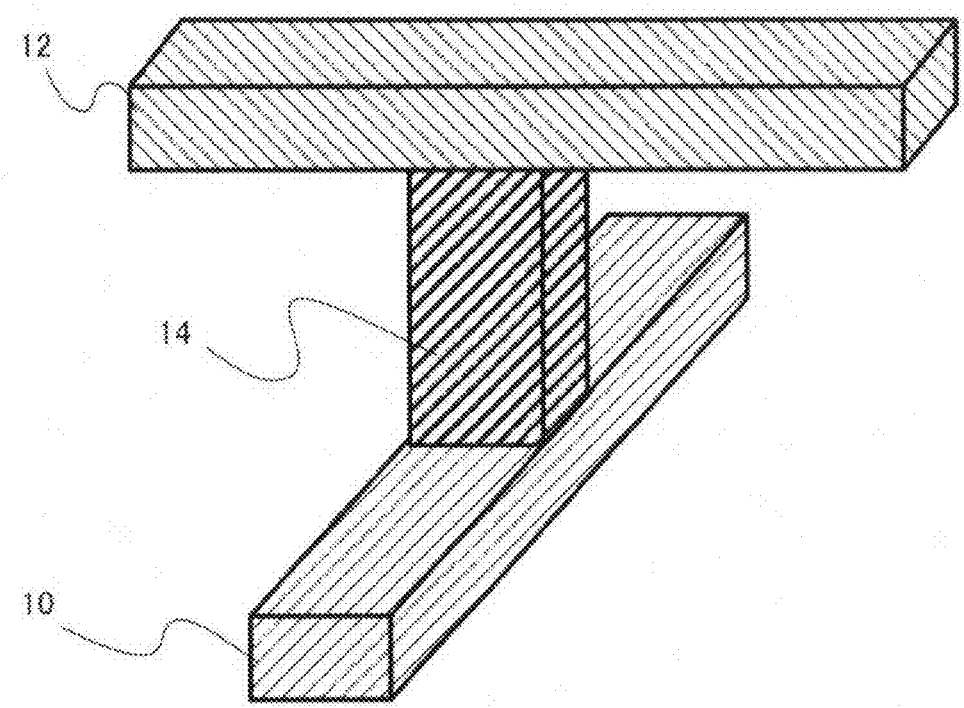
FIG. 1 is a schematic perspective view of an organic molecular memory of a semiconductor device in a first embodiment.

FIG. 1 is a schematic perspective view of an organic molecular memory in this embodiment. The organic molecular memory in the embodiment is a cross point type memory device. As shown in FIG. 1, lower electrode wiring (first conductive layer) 10 is provided on the top of a substrate (not shown), for example. Then, upper electrode wiring (second conductive layer) 12 is provided in such a manner as to cross the lower electrode wiring 10. The electrode wiring may have a design rule of about 5 to 20 nm.

As shown in FIG. 1, an organic molecular layer 14 is provided between the lower electrode wiring 10 and the upper electrode wiring 12 at an intersection between the lower electrode wiring 10 and the upper electrode wiring 12. A plurality of organic molecules constitutes the organic molecular layer 14. The thickness of the organic molecular layer 14 is 1 nm or more to 20 nm or less, for example.

The first conductive layer 10 and the second conductive layer 12 are formed of a metal, for example. Other than the metal, a conductor such as a semiconductor, a metal semiconductor compound, or a metal oxide may be used.

The organic molecular layer 14 is provided at each of intersections between wires of the lower electrode wiring 10 and wires of the upper electrode wiring 12 as shown in FIG. 1 to form a memory cell. In this manner, a memory cell array composed of a plurality of memory cells is realized.

Figure 2:
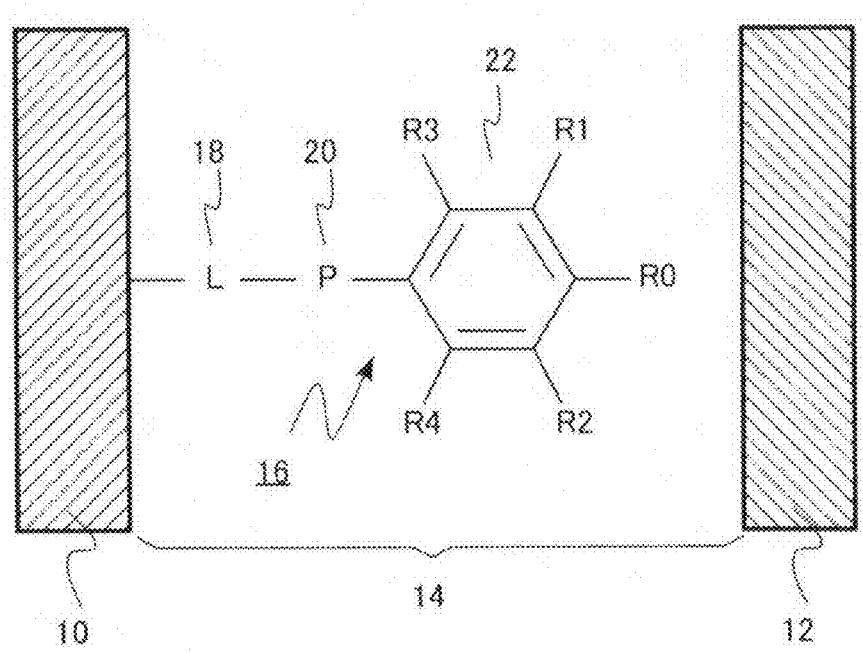
FIG. 2 is a schematic view showing a structure of a memory cell in the first embodiment.

FIG. 2 is a schematic view showing a structure of a memory cell in this embodiment. The organic molecular layer 14 is composed of a plurality of organic molecules (hereinafter, also referred to simply as molecules) 16. FIG. 2 shows only a single organic molecule 16 for convenience. The organic molecular layer 14 is a self-assembled monolayer (SAM) of the organic molecules 16.

The organic molecule 16 includes a linker group (L) 18 bonded to the first conductive layer 10, a π conjugated chain (P) 20 bonded to the linker group 18, and a phenyl group 22 bonded to the π conjugated chain 20 opposite to the linker group 18 and facing the second conductive layer 12. In other words, the organic molecule 16 has the linker group 18 at one end and the phenyl group 22 at the other end.

The linker group 18 is chemically bonded to the first conductive layer 10, thereby fixing the organic molecule 16 to the first conductive layer 10.

In the π conjugated chain 20, single bonds and double bonds or triple bonds are bonded alternately, and the carbon number is more than twelve and not more than forty six. The π conjugated chain 20 includes electron-accepting groups (A) or electron-donating groups (D) arranged in line asymmetry with respect to a bonding direction of the π conjugated chain 20. The bonding direction of the π conjugated chain 20 is an extending direction of a main chain of the π conjugated chain 20. Hereinafter, the electron-accepting group (A) is also referred to as an acceptor group, and the electron-donating group (D), a donor group.

The π conjugated chain 20 is a resistance variable type molecular chain. A resistance variable type molecular chain is a molecular chain that develops a function of varying the resistance, depending on the presence or absence of an electric field or a charge injection.

The phenyl group 22 has substituents R0, R1, R2, R3, and R4. The substituent R0 is an electron-accepting group (A) or an electron-donating group (D). The phenyl group 22 is not chemically bonded to the second conductive layer 12.

Figure 3:
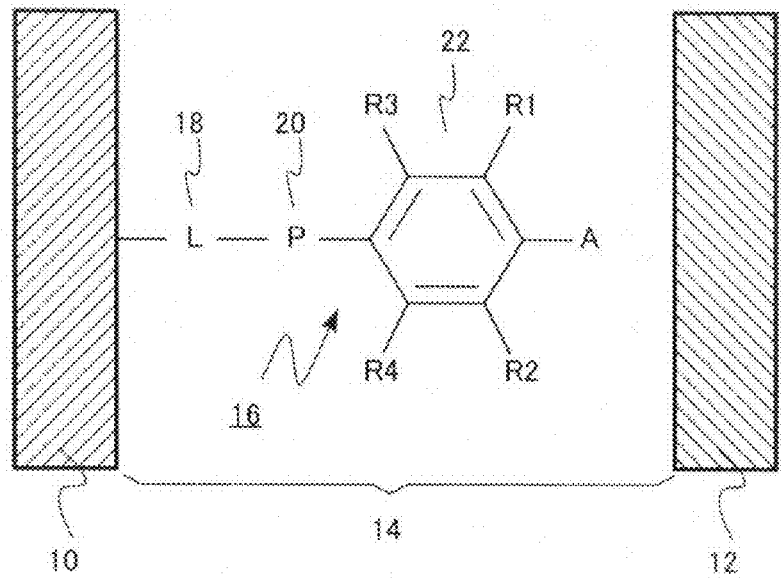
FIG. 3 is a schematic view showing a structure of a memory cell in the first embodiment.

FIG. 3 is a schematic view showing a structure of a memory cell in this embodiment. In this embodiment, as shown in FIG. 3, the substituent R0 shown in FIG. 2 is an electron-accepting group (A).

In the organic molecule 16 in this embodiment, the phenyl group 22 with the electron-accepting group (A) is unevenly distributed in the organic molecule 16, forming a π-A structure. This structure forms a potential due to a dipole in the organic molecule 16. This potential provides a rectifying property to the organic molecule 16.

In this embodiment, a dipole moment is developed from the electron-accepting group (A) of the phenyl group 22 toward the π conjugated chain (P) 20. With this, with reference to the first conductive layer 10, rectification in which application of a positive voltage to the second conductive layer 12 is a forward bias is developed.

Further, the organic molecule 16 in this embodiment has the π conjugated chain 20 that is a resistance variable type molecular chain, and thus has a memory property. Therefore, the organic molecule 16 has both a memory property and a rectifying property due to voltage application.

The dipole in the organic molecule 16 creates image charges in the first conductive layer 10 and the second conductive layer 12 sandwiching the organic molecule 16. Image force produced by the image charges increases the potential due to the dipole, enhancing rectification.

Further, the phenyl group 22 has the electron-accepting group (A) in the position of the substituent R0. Thus, the density of states (DOS) around the phenyl group 22 is increased. Accordingly, the charge tunneling rate between the second conductive layer 12 and the organic molecule 16 is increased, resulting in a memory cell with a high ON/OFF ratio.

Hereinafter, the effect of the organic molecular memory in this embodiment will be described in detail. The following description of the effect is the description that is not only for this embodiment and is common to all embodiments in the specification.

When an organic molecule has a D-σ-A or D-π-A structure, ionization of the molecule such as $D^+$-σ-$A^-$ or $D^+$-π-$A^-$, which is a characteristic fluctuation factor due to a surrounding environment, is inevitable. In this embodiment, rectification is developed by a mechanism different from these structures.

(Method of Developing Rectification)

The inventors have focused attention on the fact that the size of a molecule is small, and a molecule is sandwiched between electrodes. Then, the inventors have theoretically found that potentials necessary for charge injection become asymmetrical because potentials (image force) produced by a dipole in a molecule with a π-A structure and image charges at the electrodes are asymmetrical, and the asymmetrical potentials due to the dipole become a barrier to a charge injection even when the charge injection is to the same energy level.

Figure 4:
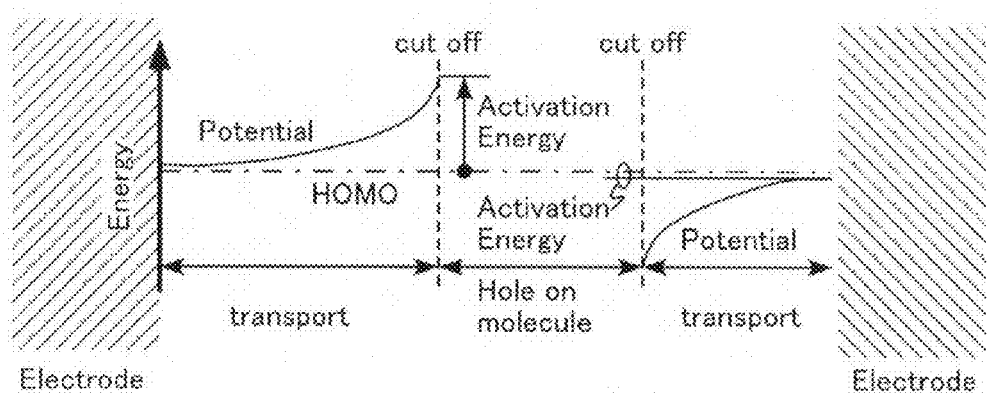
FIG. 4 is an explanatory diagram of a model for calculating a charge injection barrier.

FIG. 4 is an explanatory diagram of a model for calculating a charge injection barrier. A potential due to the dipole, the resulting activation energy, and the activation energy at the time of a charge injection due to cut off of a molecule (a spatial boundary between a charge inside the molecule and a charge outside the molecule) are shown.

A potential distribution including image charges due to electrodes is determined from a charge distribution (distribution of bond dipole moment) of a molecule fixed in the electrodes. A charge distribution in a molecule (distribution of bond dipole moment) can be obtained by a molecular orbital method such as GAUSSIAN. Experiments have shown that in the conduction of a carrier of a diphenyl molecule, the conduction of a carrier between electrodes due to tunneling is predominant, and a charge does not stay on the molecule. On the other hand, it has been found that in the conduction of a carrier of a terphenyl molecule, conduction in which a charge is once injected into the molecule to ionize the molecule, and then an electron comes out to the opposite electrode is predominant.

This results show that a charge injected from one electrode by tunneling is conducted to one or more phenyl rings and then stops on the molecule. That is, the charge needs to go over a potential from the electrode to an end of a first phenyl ring. Thus, by calculating the potential, the activation energy is determined.

Figure 5:
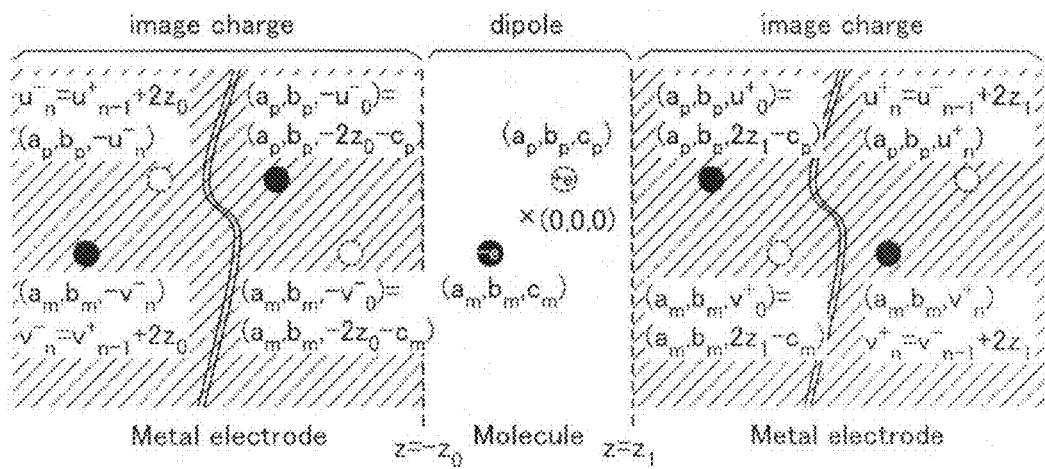
FIG. 5 is an explanatory diagram of calculation of image charges due to a dipole.

FIG. 5 is an explanatory diagram of calculation of image charges due to a dipole. Hereinafter, a specific method of calculating a potential due to an intramolecular dipole will be described.

A dipole approximation is an approximation that holds only when the distance between charges in the dipole is sufficiently smaller than the distance between a position of interest and the dipole. Therefore, a system considering image force due to charges of a dipole cannot provide a correct result. Thus, an approximation is not performed below, and in order to calculate a potential due to a dipole including an effect of image force, the dipole is expressed by positive and negative two elementary charges and a distance. The position of a +e charge is $(a_p, b_p, c_p)$, and the position of a −e charge is $(a_m, b_m, c_m)$.

Electrodes are located in regions $z=-z_o$ and $z=z_1$, and sandwich a dipole. At this time, with the coordinates of image charges due to the charges of the dipole generated in the negative-side electrode as $(a_p, b_p, -u^-_0)$ (an image charge corresponding to the positive charge of the dipole: the sign of the charge is negative) and $(a_m, b_m, -v^-_0)$ (an image charge corresponding to the negative charge of the dipole: the sign of the charge is positive) as shown in FIG. 5, $$u_0^- = 2z_0 + c_p$$

$$v_0^- = 2z_0 + c_m \quad \text{[Mathematical Formula 1]}$$

Likewise, with the coordinates of image charges due to the charges of the dipole generated in the positive-side electrode as $(a_p, b_p, u^+_0)$ (an image charge corresponding to the positive charge of the dipole: the sign of the charge is negative) and $(a_m, b_m, v^+_0)$ (an image charge corresponding to the negative charge of the dipole: the sign of the charge is positive), $$u_0^+ = 2z_1 - c_p$$

$$v_0^+ = 2z_1 - c_m \quad \text{[Mathematical Formula 2]}$$

are obtained.

Conditions under which the charges of the dipole exist between the electrodes, $$-z_0 < \min(c_m, c_p)$$

$$z_1 > \max(c_m, c_p) \quad \text{[Mathematical Formula 3]}$$

hold.

Next, since there are image charges in the negative-side electrode induced by the image charges in the positions $(a_p, b_p, u^+_0)$ and $(a_m, b_m, v^+_0)$ induced in the positive-side electrode, it is necessary to take in this effect. Generally, with the coordinates of the image charges induced in the negative-side electrode by the image charges in the positions $(a_p, b_p, u^+_{n-1})$ and $(a_m, b_m, v^+_{n-1})$ in the positive-side electrode as $(a_p, b_p, -u^-_n)$ and $(a_m, b_m, -v^-_n)$, respectively, $$u_n^- = 2z_0 + u_{n-1}^+$$

$$v_n^- = 2z_0 + v_{n-1}^+ \quad \text{[Mathematical Formula 4]}$$

Likewise, with the coordinates of image charges induced in the positive-side electrode by image charges in the positions $(a_p, b_p, -u^-_{n-1})$ and $(a_m, b_m, -v^-_{n-1})$ in the negative-side electrode as $(a_p, b_p, u^+_n)$ and $(a_m, b_m, v^+_n)$, respectively, $$u_n^+ = 2z_1 + u_{n-1}^-$$

$$v_n^+ = 2z_1 + v_{n-1}^- \quad \text{[Mathematical Formula 5]}$$

In summary, $$\begin{pmatrix} u_n^- \\ u_n^+ \end{pmatrix} = \begin{pmatrix} 0 & 1 \\ 1 & 0 \end{pmatrix} \begin{pmatrix} u_{n-1}^- \\ u_{n-1}^+ \end{pmatrix} + 2 \begin{pmatrix} z_0 \\ z_1 \end{pmatrix} \quad \text{[Mathematical Formula 6]}$$

$$\begin{pmatrix} v_n^- \\ v_n^+ \end{pmatrix} = \begin{pmatrix} 0 & 1 \\ 1 & 0 \end{pmatrix} \begin{pmatrix} v_{n-1}^- \\ v_{n-1}^+ \end{pmatrix} + 2 \begin{pmatrix} z_0 \\ z_1 \end{pmatrix} \quad \text{[Mathematical Formula 7]}$$

If it is repeated for another stage, $$\begin{pmatrix} u_n^- \\ u_n^+ \end{pmatrix} = \begin{pmatrix} u_{n-2}^- \\ u_{n-2}^+ \end{pmatrix} + 2 \begin{pmatrix} z_0 + z_1 \\ z_0 + z_1 \end{pmatrix} \quad \text{[Mathematical Formula 8]}$$

$$\begin{pmatrix} v_n^- \\ v_n^+ \end{pmatrix} = \begin{pmatrix} v_{n-2}^- \\ v_{n-2}^+ \end{pmatrix} + 2 \begin{pmatrix} z_0 + z_1 \\ z_0 + z_1 \end{pmatrix} \quad \text{[Mathematical Formula 9]}$$

Since the sign of image charges varies for each stage, n is classified by even numbers and odd numbers, $$\begin{pmatrix} u_{2m}^- \\ u_{2m}^+ \end{pmatrix} = \begin{pmatrix} c_p \\ -c_p \end{pmatrix} + \begin{pmatrix} (2m+2)z_0 + 2mz_1 \\ 2mz_0 + (2m+2)z_1 \end{pmatrix} \quad \text{[Mathematical Formula 10]}$$

$$\begin{pmatrix} u_{2m+1}^- \\ u_{2m+1}^+ \end{pmatrix} = \begin{pmatrix} -c_p \\ c_p \end{pmatrix} + \begin{pmatrix} (2m+2)(z_0 + z_1) \\ (2m+2)(z_0 + z_1) \end{pmatrix} \quad \text{[Mathematical Formula 11]}$$

$$\begin{pmatrix} v_{2m}^- \\ v_{2m}^+ \end{pmatrix} = \begin{pmatrix} c_m \\ -c_m \end{pmatrix} + \begin{pmatrix} (2m+2)z_0 + 2mz_1 \\ 2mz_0 + (2m+2)z_1 \end{pmatrix} \quad \text{[Mathematical Formula 12]}$$

$$\begin{pmatrix} v_{2m+1}^- \\ v_{2m+1}^+ \end{pmatrix} = \begin{pmatrix} -c_m \\ c_m \end{pmatrix} + \begin{pmatrix} (2m+2)(z_0 + z_1) \\ (2m+2)(z_0 + z_1) \end{pmatrix} \quad \text{[Mathematical Formula 13]}$$

Considering that an original charge and an image charge have the opposite signs, the positions of charges due to the positive charge are the original charge $(a_p, b_p, c_p)$, the resulting image charges $(a_p, b_p, -u^-_{2m+1})$ and $(a_p, b_p, u^+_{2m+1})$, and further, inverted image charges $(a_p, b_p, -u^-_{2m})$ and $(a_p, b_p, u^+_{2m})$, and the positions of charges due to the negative charge are the original charge $(a_m, b_m, -c_m)$, the resulting image charges $(a_m, b_m, -v^-_{2m+1})$ and $(a_m, b_m, v^+_{2m+1})$, and further, inverted image charges $(a_m, b_m, -v^-_{2m})$ and $(a_m, b_m, v^+_{2m})$.

From the above, a potential $U^+(x, y, z)$ produced at a position $(x, y, z)$ due to the positive charge is calculated as $$U^+(x, y, z) = \quad \text{[Mathematical Formula 14]}$$

$$\frac{e}{4\pi\varepsilon} \frac{1}{\sqrt{(a_p - x)^2 + (b_p - y)^2 + (c_p - z)^2}} +$$

$$\sum_{m=0}^{\infty} \frac{e}{4\pi\varepsilon} \frac{1}{\sqrt{(a_p - x)^2 + (b_p - y)^2 + (u^-_{2m+1} + z)^2}} +$$

$$\sum_{m=0}^{\infty} \frac{e}{4\pi\varepsilon} \frac{1}{\sqrt{(a_p - x)^2 + (b_p - y)^2 + (u^+_{2m+1} + z)^2}} -$$

-continued $$\sum_{m=0}^{\infty} \frac{e}{4\pi\varepsilon} \frac{1}{\sqrt{(a_p - x)^2 + (b_p - y)^2 + (u_{2m}^- + z)^2}} -$$

$$\sum_{m=0}^{\infty} \frac{e}{4\pi\varepsilon} \frac{1}{\sqrt{(a_p - x)^2 + (b_p - y)^2 + (u_{2m}^+ - z)^2}}$$

Likewise, a potential $U^-(x, y, z)$ produced at a position (x, y, z) due to the negative charge is calculated as $$U^-(x, y, z) =$$ [Mathematical Formula 15]

$$-\frac{e}{4\pi\varepsilon} \frac{1}{\sqrt{(a_m - x)^2 + (b_m - y)^2 + (c_m - z)^2}} -$$

$$\sum_{m=0}^{\infty} \frac{e}{4\pi\varepsilon} \frac{1}{\sqrt{(a_m - x)^2 + (b_m - y)^2 + (v_{2m+1}^- + z)^2}} -$$

$$\sum_{m=0}^{\infty} \frac{e}{4\pi\varepsilon} \frac{1}{\sqrt{(a_m - x)^2 + (b_m - y)^2 + (v_{2m+1}^+ - z)^2}} +$$

$$\sum_{m=0}^{\infty} \frac{e}{4\pi\varepsilon} \frac{1}{\sqrt{(a_m - x)^2 + (b_m - y)^2 + (v_{2m}^- + z)^2}} +$$

$$\sum_{m=0}^{\infty} \frac{e}{4\pi\varepsilon} \frac{1}{\sqrt{(a_m - x)^2 + (b_m - y)^2 + (v_{2m}^+ - z)^2}}$$

From the above, the total potential $U(x, y, z)$ to be determined is given by $$U(x,y,z) = U^+(x,y,z) + U^-(x,y,z)$$ [Mathematical Formula 16]

A carrier injected from outside the molecule can feel the potential due to the dipole of the molecule. Thus, it is found that the maximum value of this potential barrier constitutes activation energy that the carrier needs to get past.

In order to argue the maximum value of the potential, it is of necessity to clarify whether the carrier is outside the molecule or the inside the molecule. If the distance between the dipole and the carrier can be made shorter without limit, it causes the divergence of a Coulomb potential. In practice, when those are made sufficiently close to each other, they come into a mixed state, and the Coulomb potential is incorporated into a charge rearrangement energy of the state or a polarization energy of the surroundings, to prevent the divergence of the potential from occurring. A distance of the boundary which gives rise to such a state is called a cut-off distance (see FIG. 4).

The cut off distance in the π conjugated chain can be derived from the following experimental results. Conductance obtained from the current-voltage characteristics of diphenylthiol (thiol is attached to an end of two bonded phenyl rings) sandwiched between gold corresponds to a value due to tunneling between gold electrodes. However, the current-voltage characteristics of terphenylthiol (three phenyl rings are linearly arranged and bonded and thiol is attached to an end thereof) do not correspond to the value due to tunneling between gold electrodes, which means that there is a conduction path in which a charge injected from an electrode is trapped in a molecule.

Thus, although tunneling transport from an electrode to one phenyl ring is possible, a charge is trapped in a central phenyl ring. From this, the length of one phenyl ring connected to the electrode is a cut off distance.

It is considered that a carrier injected from the electrode is transported along the z axis, and thus a potential variation along the z axis is calculated. Two cutoffs (distances) along the z axis being taken into account, $-z_{c0}$ is the z coordinate closer to electrode 1, and $z_{c1}$ is the z coordinate of electrode 2. At this time, activation energy $\Delta_1$ and $\Delta_2$ is calculated to be, $$\Delta_1 = \max_{-z_0 < z < -z_{c0}} (U(z))$$ [Mathematical Formula 17]

$$\Delta_2 = \max_{z_{c1} < z < z_1} (U(z))$$

Using the activation energy, with V as a bias applied to electrode 2 (the second conductive layer) with reference to electrode 1 (the first conductive layer), and with Ip as an ionizing potential of a molecule (a vacuum level viewed from the HOMO (Highest Occupied Molecular Orbital) level), when a molecule is bonded only to electrode 1 by a linker, using a work function $E_{F1}$ of electrode 1, a threshold voltage $V_{th}^+$ on the positive side and a threshold voltage $V_{th}^-$ on the negative side at which current rises are given by, $$V_{th}^+ = \frac{I_P + \Delta_2 - E_{F1}}{\eta}$$ [Mathematical Formula 18]

$$V_{th}^- = -\frac{I_P + \Delta_1 - E_{F1}}{1 - \eta}$$

Here, η is the ratio of a potential difference between electrode 1 and the molecule to the bias applied between the electrodes. With $\phi(x, y, z)$ as a wave function (generally the HOMO) contributing to the conduction of the molecule, using length l $$\int_{-\infty}^{\infty} dx \int_{-\infty}^{\infty} dy \int_{-z_0}^{l} dx \phi^*(x, y, z)\phi(x, y, z) = \frac{1}{2}$$ [Mathematical Formula 19]

η is given by $$\eta = \frac{l}{z_0 + z_1}$$ [Mathematical Formula 20]

Here, $\phi^*(x, y, z)$ represents a complex conjugate function of $\phi(x, y, z)$. Generally, for a molecule symmetrical in the z direction, it can be considered that $\eta=0.5$.

When the work functions of electrode 1 and electrode 2 are different, also using work functions $E_{F1}$ and $E_{F2}$ of electrode 1 and electrode 2, $V_{th}^+$ and $V_{th}^-$ are given by, $$V_{th}^+ = \frac{I_P + \Delta_2 - E_{F2}}{\eta} \quad \text{[Mathematical Formula 21]}$$

$$V_{th}^- = -\frac{I_P + \Delta_1 - E_{F1}}{1 - \eta}$$

These expressions show that even when activation energy $\Delta_1$ and $\Delta_2$ is different, different electrodes can cancel the effect by the difference in the work functions. Thus, it is necessary to choose the material of electrodes for developing rectification. A way of choosing depends on the direction of a dipole vector in a molecule, or the like.

Using these threshold voltages, a rectification parameter viewed from the current-voltage characteristics can be defined as, $$\xi = \frac{-V_{th}^-}{V_{th}^+ - V_{th}^-} \quad \text{[Mathematical Formula 22]}$$

In this definition, $\xi$ is a dimensionless number in a range of $0<\xi<1$.

$\xi=0.5$ means a lack of rectification, that is, current rises at positive/negative voltage with a bias of the same absolute value. In a range $\xi>0.5$, current easily flows on the positive bias side. For a normal diode, the positive bias corresponds to a forward direction, and the negative bias, an opposite direction. In a range $\xi<0.5$, current easily flows on the negative bias side. For a normal diode, the negative bias corresponds to a forward direction, and the positive bias, an opposite direction.

Specifically, when the direction of the dipole in the direction of the main chain of the molecule is from the second conductive layer toward the first conductive layer, only $\Delta_1$ constitutes a potential barrier (built-in potential). In order to increase the rectification ratio, it is only necessary to make $V_{th}^+$ small and make $V_{th}^-$ large, and thus it is preferable that the work function of the second conductive layer be larger ($E_{F1}<E_{F2}$). When the direction of the dipole in the direction of the main chain of the molecule is from the first conductive layer toward the second conductive layer, only $\Delta_2$ constitutes a potential barrier (built-in potential). In order to increase the rectification ratio, it is only necessary to make $V_{th}^+$ large and make $V_{th}^-$ small, and thus it is preferable that the work function of the first conductive layer be larger ($E_{F2}<E_{F1}$). Generally, the activation energy at $0.6>\xi>0.4$ is small, resulting in a large leak current, which is not preferable for application to a circuit.

(Design of Molecule Having Rectifying Property)

From the above, it is clear that a dipole of a molecule dominates rectification. Further, it is a component of a dipole in a main chain direction (conducting direction) of a molecule that contributes to activation energy. For the creation of such a dipole, it is effective to attract π electrons uniformly spreading across a π conjugated chain in a one-dimensional chain by a donor or an acceptor attached in one side. It is possible to develop a larger dipole by attaching a donor to one side and an acceptor to the other side. However, this structure is ionized, thus being susceptible to water or the like. Further, since positive and negative ionized areas coexist, repulsive force inevitably strongly acts on conductive charges, interfering with conduction.

In order for the donor or acceptor areas not to interfere with conduction, the donor or the acceptor also preferably has a π conjugated structure. For this, it is possible to use a donor or an acceptor in which a substituent is introduced into a π conjugated system such as a phenyl group. The effect of a dipole due to the substituent will be discussed.

(Method of Developing Memory Property)

Described above is the effect of a static potential created by a dipole. Other than this, there is an effect that a dipole has on a charge through a phonon (electron-lattice interaction. This equals to electron-phonon interaction or electron-phonon coupling). Collective excitation due to heat, that is, phonons cause displacements of atoms in a molecule from equilibrium positions. For a π conjugated system, a large dipole can be introduced into a substituent bonded not in a direction of a conjugated main chain but in a direction diverging from the main chain (side chain).

Figure 6:
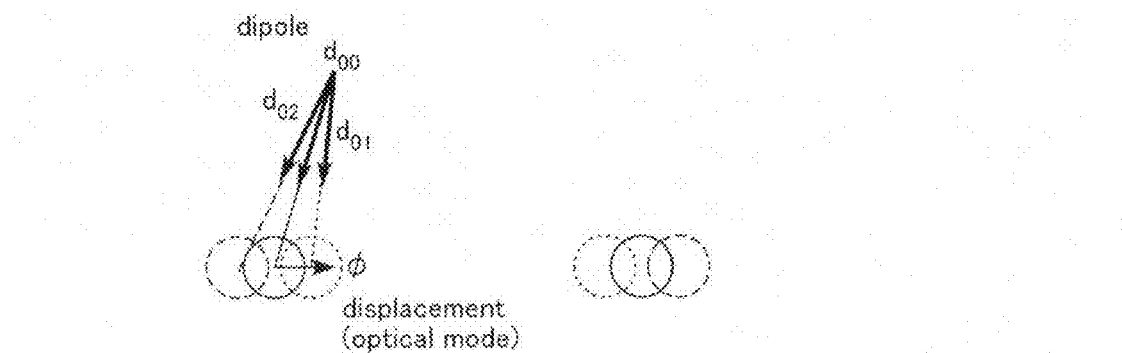
FIG. 6 is a diagram illustrating an effect of a bond moment on an electron-lattice interaction.

FIG. 6 is a diagram illustrating an effect of a bond moment on an electron-lattice interaction. As shown in FIG. 6, the dipole of these side chains cannot follow an optical phonon in the main chain, that is, cannot be displaced in the same direction, thus resulting in a displacement of the dipole direction accompanying an atom displacement in the main chain.

A change in the dipole due to this displacement in direction is written as a change in polarization due to the phonon. The polarization and a charge are combined by Coulomb force. When the polarization is large, the polarization is attracted around the charge, forming a state in which the charge and the polarization move together. This state is called polaron.

Therefore, when the position of the dipole causes a change in the effect of polarization, the conduction characteristics of the molecule is changed. Thus, it will be described below how polarization due to a phonon changes, depending on the position of a dipole.

In FIG. 6, an X direction is a lateral direction, and a plane on which a π conjugation is placed corresponds to the sheet surface, and a Y direction is a longitudinal direction. Suppose that an atom in a position (0, 0) is displaced by $\phi$ due to a phonon in the X direction. This causes a dipole in a side chain position (a,b) to change from vector $d_{00}$, $$d_{00} = \frac{|d|}{\sqrt{a^2 + b^2}}(a, b) \quad \text{[Mathematical Formula 23]}$$

to $d_{01}$, $$d_{01} = \frac{|d|}{\sqrt{(a+\phi)^2 + b^2}}(a+\phi, b) \quad \text{[Mathematical Formula 24]}$$

If displacement $\phi$ due to the phonon is sufficiently smaller than a, b, it can be approximated to be, $$\frac{1}{\sqrt{(a+\phi)^2 + b^2}} = \frac{1}{\sqrt{a^2+b^2}\sqrt{a^2 + b^2 + \frac{2a\phi + \phi^2}{a^2 + b^2}}} \quad \text{[Mathematical Formula 24]}$$

-continued $$\simeq \frac{1}{\sqrt{a^2+b^2}} \frac{1}{\sqrt{1+\frac{2a\phi}{a^2+b^2}}}$$

$$\simeq \frac{1}{\sqrt{a^2+b^2}}\left(1-\frac{a\phi}{a^2+b^2}\right)$$

Thus polarization (dipole) P induced (in the main chain direction) can be evaluated as, $$P = d_{01} - d_{00} \qquad \text{[Mathematical Formula 26]}$$

$$= \frac{|d|}{\sqrt{a^2+b^2}}\left(a - \frac{a^2\phi}{a^2+b^2}, b - \frac{ab\phi}{a^2+b^2}\right) - \frac{|d|}{\sqrt{a^2+b^2}}(a, b)$$

$$= -\frac{|d|}{\sqrt{a^2+b^2}}\left(\frac{a^2}{a^2+b^2}, \frac{ab}{a^2+b^2}\right)\phi$$

That is, the electron-lattice interaction can be increased by introducing a dipole in a side chain. Thus, a dipole introduced in this manner has a high probability of changing the conduction characteristics of an original skeleton.

Figure 7A:
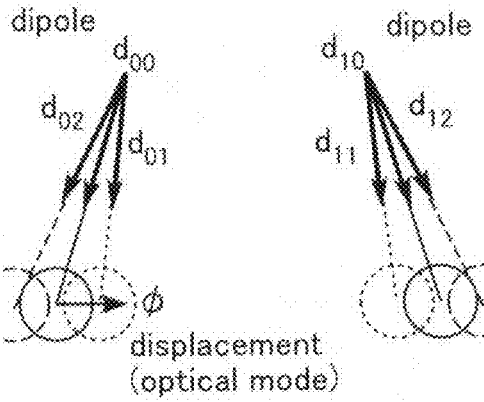
FIGS. 7A and 7B are diagrams illustrating an effect of a bond moment on an electron-lattice interaction when there is a plurality of substituents.
Figure 7B:
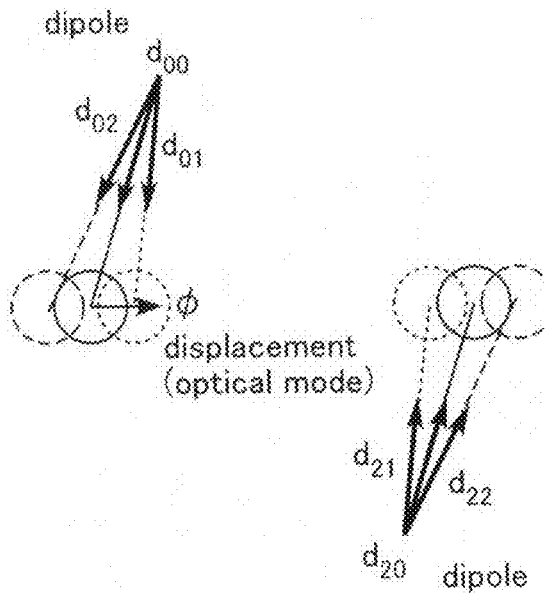

FIGS. 7A and 7B are diagrams illustrating an effect of bond moment on an electron-lattice interaction when there is a plurality of substituents. Since optical phonons are displaced in opposite directions between adjacent atoms in a π conjugated system, displacements of dipoles in side chains of the adjacent atoms are in opposite directions in a main chain direction (X direction).

This situation is shown in FIGS. 7A and 7B. When side chains having dipoles are introduced into adjacent atoms, two introductions, an introduction creating a line symmetry as shown in FIG. 7A and an introduction creating a point symmetry as shown in FIG. 7B, are conceivable.

For a line symmetry, with $P_1$ as the polarization of a dipole (a, b) due to a phonon, $$P_1 = -\frac{|d|}{\sqrt{a^2+b^2}}\left(\frac{a^2}{a^2+b^2}, \frac{ab}{a^2+b^2}\right)\phi \qquad \text{[Mathematical Formula 27]}$$

The polarization of another dipole (−a, b) is $P_2$, given from the symmetry of phonons (displacement is −φ) by, $$P_2 = \frac{|d|}{\sqrt{a^2+b^2}}\left(\frac{a^2}{a^2+b^2}, -\frac{ab}{a^2+b^2}\right)\phi \qquad \text{[Mathematical Formula 28]}$$

Thus, the total polarization P is given as, $$P = P_1 + P_2 \qquad \text{[Mathematical Formula 29]}$$

$$= \frac{|d|}{\sqrt{a^2+b^2}}\left(0, \frac{2ab}{a^2+b^2}\right)\phi$$

As is clear from this expression, it is found that in an arrangement in line symmetry, polarizations in the main chain direction cancel each other, and only a small polarization in the longitudinal direction remains. Accordingly, dipoles introduced in this manner are unlikely to change the conduction characteristics of an original skeleton.

Next, for a point symmetry, with $P_1$ as the polarization of a dipole (a, b) due to a phonon, $$P_1 = -\frac{|d|}{\sqrt{a^2+b^2}}\left(\frac{a^2}{a^2+b^2}, \frac{ab}{a^2+b^2}\right)\phi \qquad \text{[Mathematical Formula 30]}$$

The polarization of another dipole (−a, −b) is $P_2$, given from the symmetry of phonons (displacement is −φ) by, $$P_2 = \frac{|d|}{\sqrt{a^2+b^2}}\left(\frac{a^2}{a^2+b^2}, \frac{ab}{a^2+b^2}\right)\phi \qquad \text{[Mathematical Formula 31]}$$

Thus, the total polarization P is given as, $$P = P_1 + P_2 = 0 \qquad \text{[Mathematical Formula 32]}$$

It is found that $P_1$ and $P_2$ completely cancel each other. That is, contributions of dipoles introduced in point symmetry cancel each other, not contributing to an electron-lattice interaction. Thus, dipoles introduced in this manner do not change the conduction characteristics of an original skeleton.

Figure 8A:
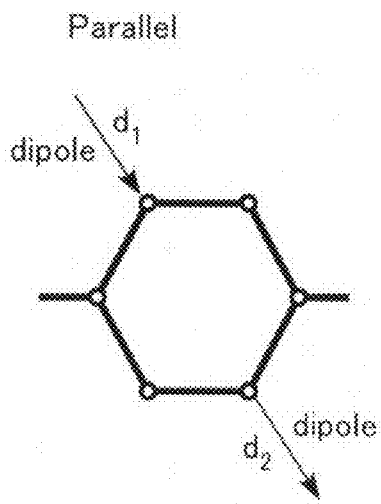
FIGS. 8A and 8B are explanatory diagrams of directions of dipoles due to a ring-shaped structure and substituents.
Figure 8B:
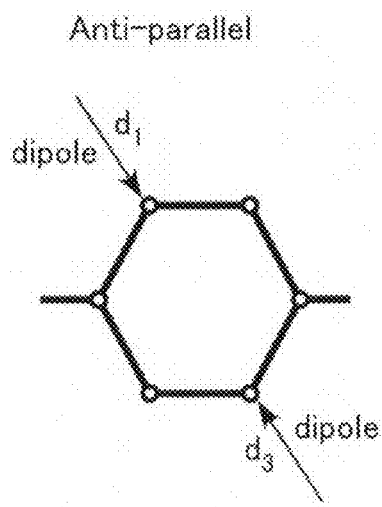

FIGS. 8A and 8B are explanatory diagrams of directions of dipoles due to a ring-shaped structure and substituents. It is a ring-shaped structure that is as important as a linear structure as described above in a π conjugated system having electrical conductivity.

The following is consideration of a ring-shaped structure (phenyl ring structure) as in FIGS. 8A and 8B and consideration of a polarization of a dipole bonded to this due to a phonon. In this case, a dipole bonded to adjacent atoms is the same as that in a straight chain, so that it is only necessary to consider dipoles in opposite positions (para positions) in the ring unique to a ring structure. In this case, there are two cases, a case where the directions of the dipoles are parallel as in FIG. 8A and a case where they are anti-parallel as in FIG. 8B.

Figure 9A:
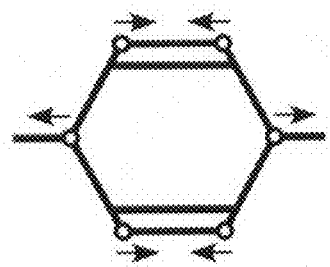
FIGS. 9A and 9B are explanatory diagrams of a ring-shaped structure and a mode of optical phonons.
Figure 9B:
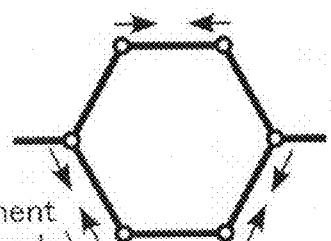
Figure 10A:
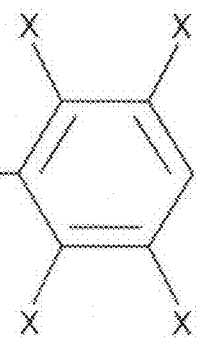
FIGS. 10A to 10E are diagrams exemplarily illustrating structures in which a phenyl group is made to be a donor or an acceptor.
Figure 10D:
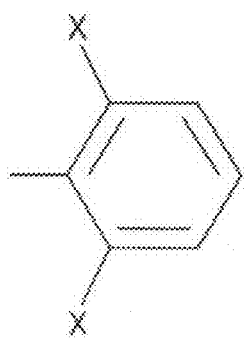
Figure 10B:
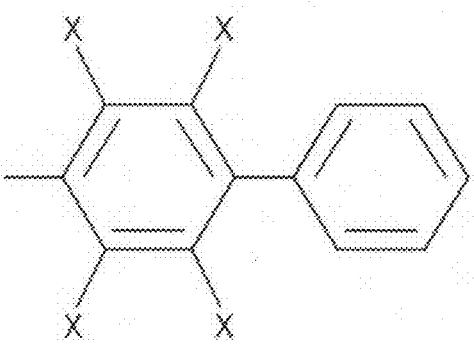
Figure 10E:
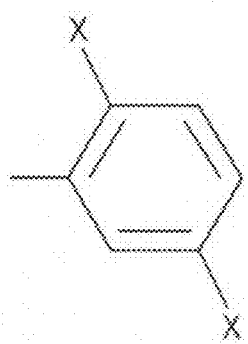
Figure 10C:
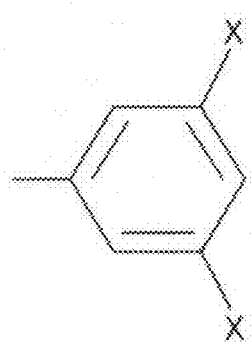

FIGS. 9A and 9B are explanatory diagrams of modes of a ring-shaped structure and optical phonons. In a ring-shaped structure, there are two kinds of mode of optical phonons, a mode (quinone mode) toward the outside of a ring shown in FIG. 9A and a mode (phenyl mode) inside a ring shown in FIG. 9B. It is known that in ring-shaped π conjugated systems connected in para positions, π electrons in a neutral state are localized in each ring, while in a charge state (polaron), π electrons are delocalized thereacross, and thus the structure becomes like quinone.

In the quinone mode, vibration directions of atoms at the bases of two dipoles are opposite directions (vibration vectors are (φ, 0) and (−φ, 0). On the other hand, in the phenyl mode, vibration directions of atoms at the bases of two dipoles are not opposite directions. In the phenyl mode, when the vibration of an upper atom in FIG. 9B is in a (φ, 0) direction, the vibration of a lower atom is in a (φ/2, $3^{1/2}$φ/2) direction, and when the vibration of an upper atom is in a (−φ/2, −$3^{1/2}$φ/2) direction, the vibration of a lower atom is in a (−φ, 0) direction.

Thus, although vibration directions in the phenyl mode are complicated, inverting the sign of φ and interchanging atoms make them into one. Thus, it is found that as in a conventional manner, only calculation for a single direction is necessary. The following is calculation on these four (=two kinds of dipole×two kinds of phonon) combinations.

Consider the case where dipoles are parallel and phonons are in the quinone mode. In this case, with $P_1$ as the polarization of a dipole (a, b) due to a phonon, $$P_1 = -\frac{|d|}{\sqrt{a^2+b^2}}\left(\frac{a^2}{a^2+b^2}, \frac{ab}{a^2+b^2}\right)\phi \quad \text{[Mathematical Formula 33]}$$

Polarization $P_2$ of another dipole (a, b) is given from the symmetry of phonons (displacement is $-\phi$) by, $$P_2 = \frac{|d|}{\sqrt{a^2+b^2}}\left(\frac{a^2}{a^2+b^2}, \frac{ab}{a^2+b^2}\right)\phi \quad \text{[Mathematical Formula 34]}$$

Thus, the total polarization P is [Mathematical Formula 35]

$$P=P_1+P_2=0$$

Complete mutual cancellation is found.

That is, contributions of dipoles introduced in point symmetry cancel each other, not contributing to an electron lattice interaction. Thus, dipoles introduced in this manner do not change the conduction characteristics of an original skeleton.

Next, consider the case where dipoles are parallel and phonons are in the phenyl mode. In this case, with $P_1$ as the polarization of a dipole (a, b) due to a phonon, $$P_1 = -\frac{|d|}{\sqrt{a^2+b^2}}\left(\frac{a^2}{a^2+b^2}, \frac{ab}{a^2+b^2}\right)\phi \quad \text{[Mathematical Formula 36]}$$

From the symmetry of phonons (displacement is ($\phi/2$, $3^{1/2}\phi/2$)), polarization $P_2$ of another dipole (a, b) is given by, $$P_2 = \quad \text{[Mathematical Formula 37]}$$

$$-\frac{|d|}{2\sqrt{a^2+b^2}}\left(\frac{a^2+\sqrt{3}\,ab}{a^2+b^2}, \frac{ab+\sqrt{3}\,b^2}{a^2+b^2}\right)\phi$$

Therefore, the total polarization P is, $$P = P_1 + P_2 \quad \text{[Mathematical Formula 38]}$$

$$= -\frac{|d|}{2\sqrt{a^2+b^2}}\left(\begin{array}{c}\frac{3a^2+\sqrt{3}\,ab}{a^2+b^2},\\ \frac{ab+(\sqrt{3}+2)b^2}{a^2+b^2}\end{array}\right)\phi$$

The dipole effect is the sum and becomes large.

That is, this arrangement can increase the electron-lattice interaction due to the phonons in the phenyl mode. Accordingly, dipoles introduced in this manner have a high probability of changing the conduction characteristics of an original skeleton.

Next, consider the case where dipoles are anti-parallel and phonons are in the quinone mode. In this case, with $P_1$ as the polarization of a dipole (a, b) due to a phonon, $$P_1 = -\frac{|d|}{\sqrt{a^2+b^2}}\left(\frac{a^2}{a^2+b^2}, \frac{ab}{a^2+b^2}\right)\phi \quad \text{[Mathematical Formula 39]}$$

From the symmetry of phonons (displacement is $-\phi$), polarization $P_2$ of another dipole ($-a$, $-b$) is given by, $$P_2 = -\frac{|d|}{\sqrt{a^2+b^2}}\left(\frac{a^2}{a^2+b^2}, \frac{ab}{a^2+b^2}\right)\phi \quad \text{[Mathematical Formula 40]}$$

Therefore, the total polarization P is, $$P = P_1 + P_2 \quad \text{[Mathematical Formula 41]}$$

$$= -2\frac{|d|}{\sqrt{a^2+b^2}}\left(\frac{a^2}{a^2+b^2}, \frac{ab}{a^2+b^2}\right)\phi$$

The dipole effect is the sum and becomes large.

That is, this arrangement can increase the electron-lattice interaction due to the phonons in the quinone mode. Accordingly, dipoles introduced in this manner have a high probability of changing the conduction characteristics of an original skeleton.

Finally, consider the case where dipoles are parallel and phonons are in the phenyl mode. In this case, with $P_1$ as the polarization of a dipole (a, b) due to a phonon, $$P_1 = -\frac{|d|}{\sqrt{a^2+b^2}}\left(\frac{a^2}{a^2+b^2}, \frac{ab}{a^2+b^2}\right)\phi \quad \text{[Mathematical Formula 42]}$$

From the symmetry of phonons (displacement is ($\phi/2$, $3^{1/2}\phi/2$)), polarization $P_2$ of another dipole ($-a$, $-b$) is given by, $$P_2 = \frac{|d|}{2\sqrt{a^2+b^2}}\left(\frac{a^2+\sqrt{3}\,ab}{a^2+b^2}, \frac{ab+\sqrt{3}\,b^2}{a^2+b^2}\right)\phi \quad \text{[Mathematical Formula 43]}$$

Therefore, the total polarization P is given as, $$P = P_1 + P_2 \quad \text{[Mathematical Formula 43]}$$

$$= -\frac{|d|}{\sqrt{a^2+b^2}}\left(\begin{array}{c}\frac{-a^2+\sqrt{3}\,ab}{a^2+b^2},\\ \frac{-ab+\sqrt{3}\,b^2}{a^2+b^2}\end{array}\right)\phi$$

As is clear from this expression, polarizations cancel each other, and only a small polarization remains. That is, contribution to an electron lattice interaction is small. Accordingly, dipoles introduced in this manner are unlikely to change the conduction characteristics of an original skeleton.

(Design of Molecule Having Memory Property)

Table 1 shows a summary of the above-described relationship between dipole positions and directions and electron-lattice interaction.

TABLE 1

| Structure | | Kind of Phonon | | |
|---|---|---|---|---|
| Dipole Position | Dipole Direction | Optical Mode | Inter-ring | Intra-ring |
| Adjacent Atoms | Same Direction (Line Symmetry) | | Weak | |
| | Opposite Directions (Point Symmetry) | | Cancel | |
| Cyclic Para Position | Parallel | Weak | Strong | Cancel |
| | Anti-parallel | Cancel | Weak | Strong |

For the conduction control of a one-dimensional π conjugated molecule, it is necessary to introduce a dipole due to a bond moment. When a plurality of dipoles is introduced, considering the mode of phonons, placement in adjacent positions allows dipoles to be introduced without causing a change in conduction characteristics. Introduction of dipoles in para positions using a phenyl ring has a high probability of being able to change conduction characteristics compared with an original structure.

FIGS. 10A to 10E are diagrams exemplarily illustrating a structure in which a phenyl group is made to be a donor or an acceptor. In order to make a phenyl group a donor or an acceptor without affecting conduction, for an acceptor in structures as in FIGS. 10A to 10E, as a substituent X, fluorine, choline, bromine, a nitro group, a cyano group, a hydroxyl group, a carbonyl group, a carboxyl group, or the like may be used, and for a donor, as a substituent X, an amino group or the like may be used.

(Design of Molecule Having Rectifying Property and Memory property)

Figure 11:
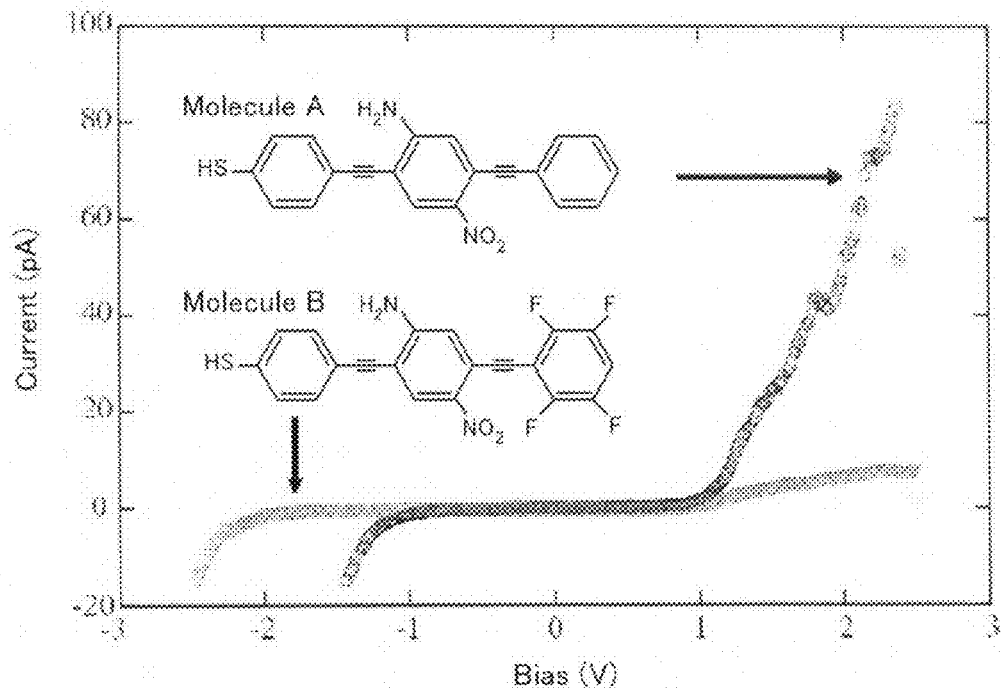
FIG. 11 shows current-voltage characteristics of two molecules having a memory property.

FIG. 11 shows current-voltage characteristics of two molecules having a memory property. The two molecules, a molecule A and a molecule B, in which a nitro group and an amino group in side chains of a phenyl group generate a negative differential resistance at about +2.5 V, can have the memory property. The molecule A, whose dipole moment is small in a main chain direction, thus has small rectification. On the other hand, the molecule B, in which the dipole moment is formed in a main chain direction by insertion of fluorine substituents, develops rectification.

Since activation energy $\Delta_1$ and $\Delta_2$, which cause rectification, are a change in potential along a main chain of a molecule (conducting direction: z axis), contribution of a dipole in the main chain direction is predominant. A donor or an acceptor as in FIGS. 10A to 10E in which the density of electrons throughout the phenyl group is modulated is effective because it modulates the density of electrons in a π conjugated system.

However, for a donor or acceptor substituent (amino group and nitro group in the example in FIG. 11) attached to a side chain of a central phenyl group, in addition to that a component of a dipole in a main chain direction becomes small, no dipole is present on a conduction path. Thus, a distance from a carrier is large, and contribution to a potential is small. Accordingly, there is a large difference between an effect due to a dipole introduced into a side chain and an effect due to polarization of π electrons in the main chain due to introduction of a donor or an acceptor into the main chain.

(Method of Increasing Rectification Ratio, ON/OFF Ratio)

Dipoles formed in a molecule by substituents such as acceptor groups or donor groups described above allow a single molecule to have a rectifying property and a memory property. For a rectifying element, a high rectification ratio is a desirable property, and for a memory element, a high ON/OFF ratio is a desirable property.

Therefore, it is important in molecule design to increase a forward bias current and an ON current. Here, an ON current means a current when a molecule is in a low resistance state, and an OFF current means a current when a molecule is in a high resistance state. Thus, when substituents for developing a rectifying property and a memory property are disposed, considerations need to be made on the energy level of a molecule and the density of states (DOS) of a molecular orbital in addition to the magnitudes and directions of dipoles. This is because, depending on where in a molecule to dispose substituents, the energy level of the molecule can vary largely, or the density of states of the molecular orbital contributing to conduction decreases.

When the HOMO level ($I_p$) of a molecule that is a conduction path becomes large, as is clear from the following expressions, the threshold voltage increases.

$$V_{th}^+ = \frac{I_P + \Delta_2 - E_{F1}}{\eta}$$ [Mathematical Formula 45]

$$V_{th}^- = -\frac{I_P + \Delta_1 - E_{F1}}{1 - \eta}$$

Even when the HOMO level ($I_p$) does not vary, a decrease in the density of states of a molecular orbital adjacent to an electrode causes a decrease in transmittance from the electrode to the molecule, resulting in a decrease in a forward bias current and an ON current. The energy level and the spread of the density of states of a molecule can be obtained by a molecular orbital method such as GAUSSIAN.

Figure 12A:
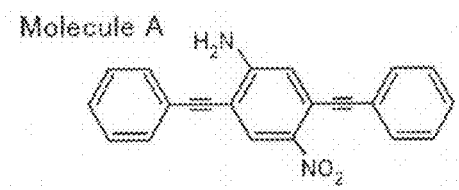
FIGS. 12A and 12B show the HOMOs of the molecules shown in FIG. 11.
Figure 12A:
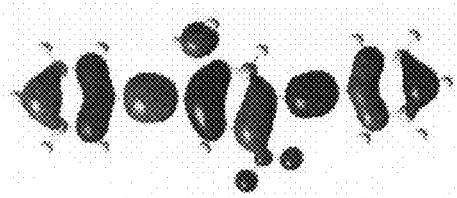
Figure 12B:
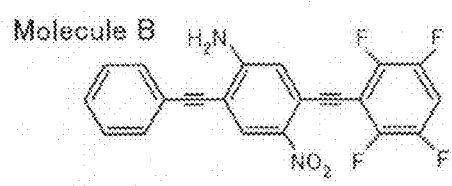
Figure 12B:
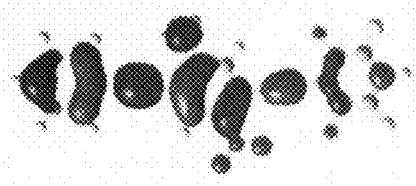

The experiment shows that even though the molecule B develops rectification due to the fluorine substitution, the ON current is one digit or more lower than that of the molecule A. FIGS. 12A and 12B show the HOMOs of the molecules shown in FIG. 11. FIG. 12A shows the molecule A, and FIG. 12B shows the molecule B. A thiol group is replaced with hydrogen to simplify calculation.

It is found that in the molecule B, the density of states of the phenyl group is decreased due to fluorine substitution compared with that of the molecule A. This decreases the tunneling rate of charges from the electrode to the molecule, lowering the ON current. From the above, to design a single molecule having a high rectification ratio and a high ON/OFF ratio, it is found preferable to dispose a substituent so that an area adjacent to an electrode (conductive layer) has the density of states.

Figure 13:
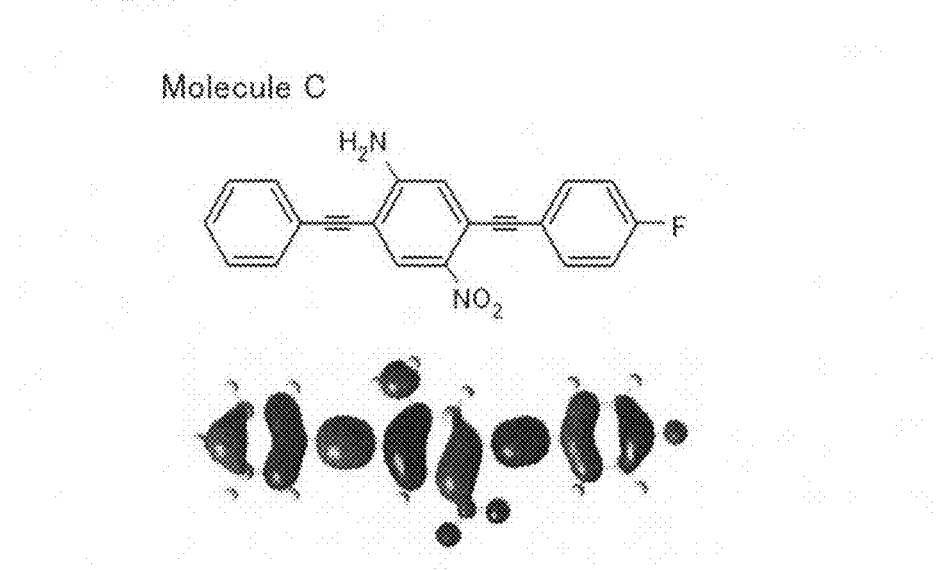
FIG. 13 is a diagram illustrating a specific example of an organic molecule in the first embodiment.

FIG. 13 is a diagram illustrating a specific example of an organic molecule in this embodiment. In a molecule C, fluorine as an acceptor group is substituted in a para position of a phenyl group at a terminal. With this, a dipole moment in a main chain direction is in the same level as in the molecule B in FIG. 12B in which fluorine is substituted in ortho positions and meta positions of the phenyl group at the terminal. Thus it can have a high rectification ratio.

The HOMO of the molecule C has the density of states at the phenyl group and the fluorine group adjacent to an electrode, like the HOMO of the molecule A in FIG. 12A. Thus, it can have a high ON/OFF ratio.

Here, fluorine used as an acceptor group is an example. When an acceptor group such as a nitro group, a halogen group such as chlorine or bromine, a cyano group, a carbonyl group, a sulfonyl group, or a trialkylamino group is used, the dipole moment is likewise formed in a main chain direction of a molecule, and the HOMO of the molecule has the density of states at a phenyl group and the acceptor group adjacent to an electrode. Thus the molecule can have a high rectification ratio and a high ON/OFF ratio.

Figure 14:
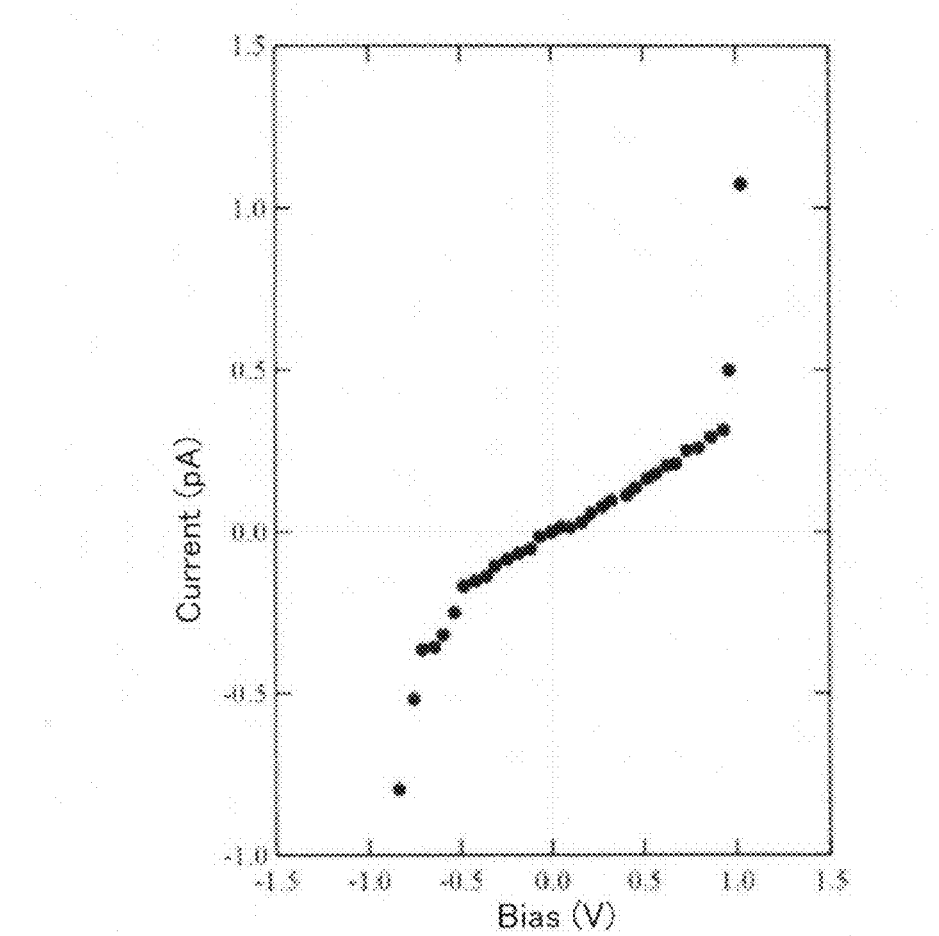
FIG. 14 is a graph showing current-voltage characteristics of a molecule with two phenyl rings having a thiol group at a terminal bonded in para positions.
Figure 15:
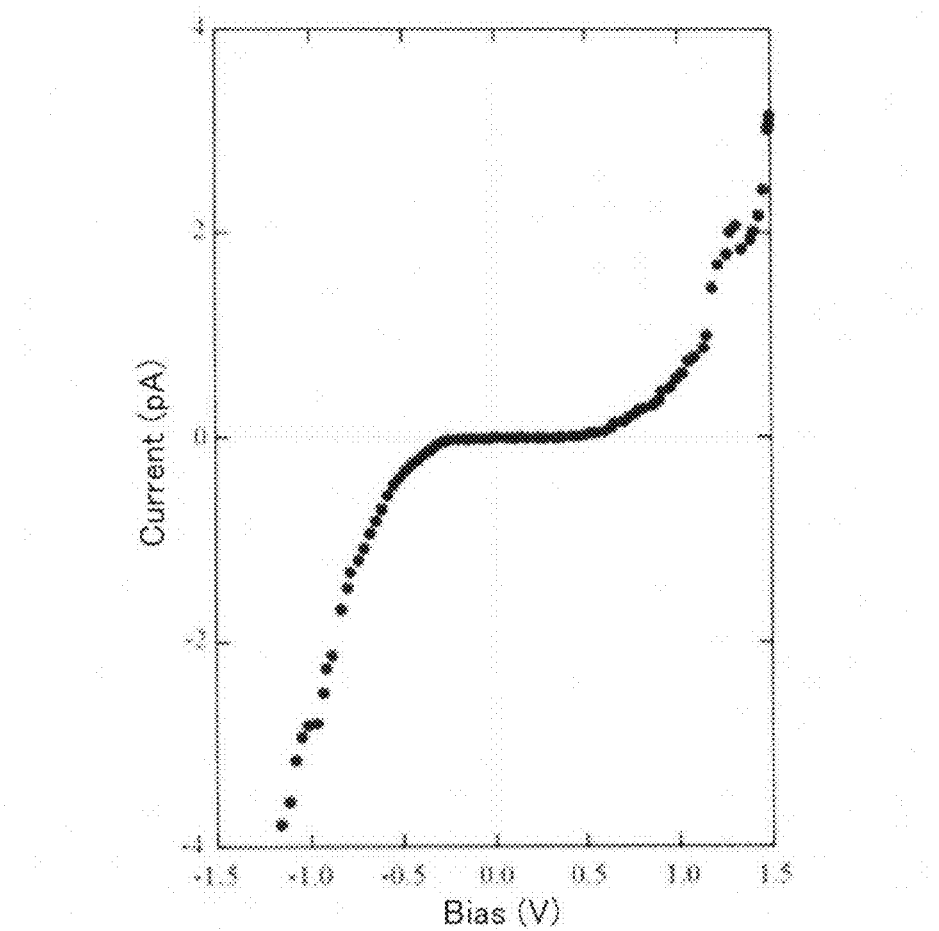
FIG. 15 is a graph showing current-voltage characteristics of a molecule with three phenyl rings having a thiol group at a terminal bonded in para positions.

FIG. 14 is a graph showing current-voltage characteristics of a molecule (diphenylthiol) in which two phenyl rings having a thiol group at a terminal are bonded in para positions. FIG. 15 is a graph showing current-voltage characteristics of a molecule (terphenylthiol) in which three phenyl rings having a thiol group at a terminal are bonded in para positions.

From these graphs, for diphenyl, current flows even in a region at a low voltage of 0.5 V or less, and this current is not observed when the number of phenyl rings is three. This means that, as described above, when the number of phenyl rings is two, electrons pass from an electrode to an electrode by tunneling. When the number of phenyl rings is three, charges stay on the molecule. Thus, it means that when the discrete level of the molecule and the level of the electrodes cannot be energetically matched, current does not flow.

In a rectifying device, current at about 0 V (in a low-voltage region) is only leak current, and only brings an effect of damaging the characteristics. Thus, a one-dimensional π conjugated molecule preferably includes a one-dimensional π conjugated chain with a length causing small leak current made by alternately bonding twelve or more single bonds and double bonds or triple bonds.

When the length of a π conjugated system is long, a voltage drop due to charge conduction in a molecule or the like becomes a problem. Therefore, it is preferable to be a one-dimensional π conjugated chain (ten benzene rings) made by alternately bonding forty-six or less carbon single bonds and double bonds or triple bonds, or shorter. It is known that under a charge state (carrier=polaron), π electrons are delocalized across benzene rings, and become stable when they spread over five benzene rings. Thus, with the length of ten or more benzene rings, a plurality of carriers (polarons) can stably exist in a single molecular chain.

Since a π conjugated system is one dimensional, carriers cannot pass each other. Thus, movements of carriers agree with the slowest movement of the carriers aligned one-dimensionally.

A repulsive potential due to Coulomb force between carriers becomes activation energy of movement. As a result, compared with a molecular length that allows only one carrier to enter, a molecular length that allows a plurality of carriers to enter reduces an average moving speed of carriers, in other words, reduces current. Thus a molecule with a molecular length that allows two polarons to enter, that is, ten or less benzene rings is preferable.

For the structure, a paraphenylene derivative, an oligothiophene derivative, an oligopyrol derivative, an oligofuran derivative, a paraphenylenevinylene derivative, a phenylethynylene derivative, or the like is used.

The substituent R0 of the phenyl group 22 in this embodiment is an electron-accepting group (A). The electron-accepting group (A) is, for example, a nitro group (—NO$_2$), halogen (—F, Cl, —Br, —I), a cyano group (—C≡N), a carbonyl group (—C(=O)—), a sulfonyl group (—S(=O)$_2$—), or a trialkylamino group (—N+R$_3$).

The substituents R1, R2, R3, and R4 of the phenyl group 22 in this embodiment are each hydrogen, an electron-accepting group (A), or an electron-donating group (D). The electron-accepting group (A) is, for example, a nitro group (—NO$_2$), halogen (—F, —Cl, —Br, —I), a cyano group (—C≡N), a carbonyl group (—C(=O)—), a sulfonyl group (—S(=O)$_2$—), or a trialkylamino group (—N+R$_3$). The electron-donating group (D) is an alkoxy group (—OR), a hydroxyl group (—OH), an amino group (—NH$_2$), an alkylamino group (—NHR), a dialkylamino group (—NR$_2$) or an amide group (—NHCOR).

At least one of the substituents R1, R2, R3, and R4 of the phenyl group 22 in this embodiment is preferably an electron-donating group (D). This is because, since the substituent R0 is the electron-accepting group (A), provision of the electron-donating group (D) allows strengthening of the dipole moment, improving rectification. In particular, the substituents R3 and R4 are preferably electron-donating groups (D), and the substituents R1 and R2, hydrogen.

The substituents R1, R2, R3, and R4 of the phenyl group 22 in this embodiment are preferably arranged in line symmetry with respect to the bonding direction of the π conjugated chain (P) 20. This is because the arrangement in line symmetry causes the direction of the dipole moment in parallel with an extending direction of the organic molecule 16, allowing the organic molecule 16 to effectively develop rectification.

The substituents R1, R2, R3, and R4 of the phenyl group 22 in this embodiment are preferably all hydrogen. This is because making the substituents R1, R2, R3, and R4 hydrogen increases the density of states (DOS) around the phenyl group 22.

The organic molecule 16 preferably has a dipole moment of 1.3 Debye (=4.3×10$^{-30}$ C·m) or more to 15 Debye (=50× 10$^{-30}$ C·m) or less in the bonding direction. This is because, below 1.3 Debye, there is a possibility that sufficient rectification cannot be obtained. Over 15 Debye, the reset voltage of memory data becomes too high, making it difficult to reset memory data.

As described above, in the π conjugated chain (P) 20 in the organic molecule 16, single bonds and double bonds or triple bonds are alternately bonded, and the carbon number is more than twelve and less than or equal to forty six. With the carbon number less than or equal to twelve, there is a high possibility that electrons tunnel between the first conductive layer 10 and the second conductive layer 12, and the organic molecule 16 does not contribute to the conduction of electrons. With the carbon number over forty six, the resistance of the organic molecule 16 becomes too high, which is not desirable. The carbon number is more preferably forty or less.

The π conjugated chain (P) 20 is a resistance variable type molecular chain including electron-accepting groups (A) or electron-donating groups (D) arranged in line asymmetry with respect to the bonding direction of the π conjugated chain 20. This structure causes the organic molecule 16 to develop a memory property.

Figure 16A:
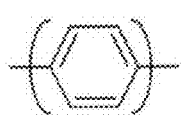
FIGS. 16A to 16F are diagrams exemplarily illustrating structures included in a π conjugated chain in the first embodiment.
Figure 16B:
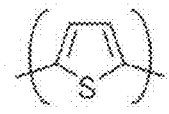
Figure 16C:
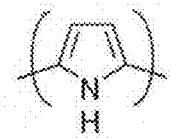
Figure 16D:
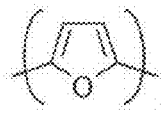
Figure 16E:
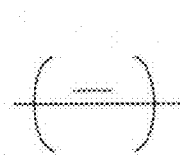
Figure 16F:
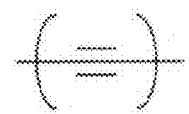

FIGS. 16A to 16F are diagrams exemplarily illustrating a structure included in the π conjugated chain (P) 20. The π conjugated chain (P) 20 preferably includes a phenylene ring (FIG. 16A), a thiophene ring (FIG. 16B), a pyrrole ring (FIG. 16C), a furan ring (FIG. 16D), ethylene (FIG. 16E), or acetylene (FIG. 16F).

In terms of structure stability, resistance change characteristics, and production ease, the π conjugated chain (P) 20 is preferably a phenyl ring sandwiched between carbon bonds of single bonds-double bonds or triple bonds-single bonds, and having an electron-accepting group or an electron-donating group.

As described above, the first conductive layer 10 and the second conductive layer 12 are formed of a metal, for example. Other than the metal, a conductor such as a semiconductor, a metal semiconductor compound, or a metal oxide can be used. The linker group 18 fixes the organic molecule 16 to the first conductive layer 10 by chemical bonding.

The linker group 18 is, for example, a thiol group (—S—), a silanol group (—SiR$_2$O—), an alcohol group (—O—), a phosphonic acid group (—PO$_3$—), a carboxyl group (—COO—), or an azo group (—N$_2$—).

In terms of ease of chemical bonding, a preferred material of the first conductive layer 10 differs, depending on the structure of the linker group 18. For example, when one end is a thiol group as in FIG. 3, for example, an electrode (conductive layer) on a chemically-bonded side is preferably gold (Au), silver (Ag), copper (Cu), tungsten (W), tungsten nitride (WN$_2$), tantalum nitride (TaN), or titanium nitride (TiN). Among them, gold (Au), silver (Ag), copper (Cu), or tungsten (W) that facilitates formation of a chemical bond is especially preferable.

When one end is an alcohol group, a carboxyl group, or a phosphonic acid group, for example, an electrode (conductive layer) on a chemically-bonded side is preferably tungsten (W), tungsten nitride (WN$_2$), tantalum (To), tantalum nitride (TaN), molybdenum (Mo), molybdenum nitride (MoN), or titanium nitride (TiN). Among them, tantalum (Ta), tantalum nitride (TaN), molybdenum nitride (MoN), or titanium nitride (TiN) that facilitates formation of a chemical bond is especially preferable.

When one end is a silanol group, for example, an electrode (first conductive layer) on a chemically-bonded side is preferably silicon (Si) or a metal oxide.

The first conductive layer 10 and the second conductive layer 12 may be formed of different materials, for example, different metal materials.

When the first conductive layer 10 and the second conductive layer 12 are of different metals, one of the first conductive layer 10 and the second conductive layer 12 includes Au, Ag, Cu, Pt, Pd, Fe, W, or WN$_2$, and the other includes Ta, TaN, Mo, MoN, or TiN, for example.

When the work functions of the first conductive layer 10 and the second conductive layer 12 are different, using the work function $E_{F1}$ of the first conductive layer 10, the work function $E_{F2}$ of electrode 2, and also the HOMO level ($I_P$), the threshold voltages $V_{th}^+$ and $V_{th}^-$ are given by, $$V_{th}^+ = \frac{I_P + \Delta_2 - E_{F2}}{\eta}$$ [Mathematical Formula 46]

$$V_{th}^- = -\frac{I_P + \Delta_1 - E_{F1}}{1 - \eta}$$

These expressions show that even when activation energy $\Delta_1$ and $\Delta_2$ is different, when the electrodes (conductive layers) are different, the difference in the work function can cancel the effect. Accordingly, it is necessary to choose electrodes (conductive layers) to develop rectification.

Specifically, when the direction of a dipole in a main chain direction of a molecule is from the second conductive layer 12 toward the first conductive layer 10, only $\Delta_1$ constitutes a potential barrier (built-in potential). To increase the rectification ratio, it is only necessary to make $V_{th}^+$ small and $V_{th}^-$ large. Thus it is preferable that the work function of the second conductive layer 12 be larger than the work function of the first conductive layer 10 ($E_{F1} < E_{F2}$).

When the direction of a dipole in a main chain direction of a molecule is from the first conductive layer 10 to the second conductive layer 12, only $\Delta_2$ constitutes a potential barrier (built-in potential). To increase the rectification ratio, it is only necessary to make $V_{th}^+$ large and $V_{th}^-$ small. Thus it is preferable that the work function of the first conductive layer 10 be larger than the work function of the second conductive layer 12 ($E_{F2} < E_{F1}$).

In this embodiment, since the substituent R0 is an electron-accepting group (A), the direction of the dipole in the main chain direction of the molecule is from the second conductive layer 12 toward the first conductive layer 10. Thus, the work function of the second conductive layer 12 is preferably larger than the work function of the first conductive layer 10 in terms of increasing rectification ($E_{F1} < E_{F2}$).

Charges flowing through a molecule are charges injected from an electrode by tunneling. In this embodiment, energetic alignment between the Fermi level of an electrode and the level of a molecule is used, so that tunneling from an electrode does not work when a vacuum level such as a Fowler-Nordheim mechanism is used. Therefore, when direct tunneling from an electrode to a molecule is possible, it works even when an insulating layer such as an oxide or a nitride exists on an electrode surface. However, the insulating film is preferably thin enough to allow tunneling from a metal to a molecule, and the film thickness of the insulating layer is preferably 3 nm or less.

As above, the organic molecular memory in this embodiment has a small size and a rectifying property, and allows an increase in the ON/OFF ratio.

Second Embodiment

An organic molecular memory in this embodiment is different from that in the first embodiment in that a substituent R0 of a phenyl group is an electron-donating group (D). Hereinafter, part of content overlapping with that in the first embodiment will not be described.

Figure 17:
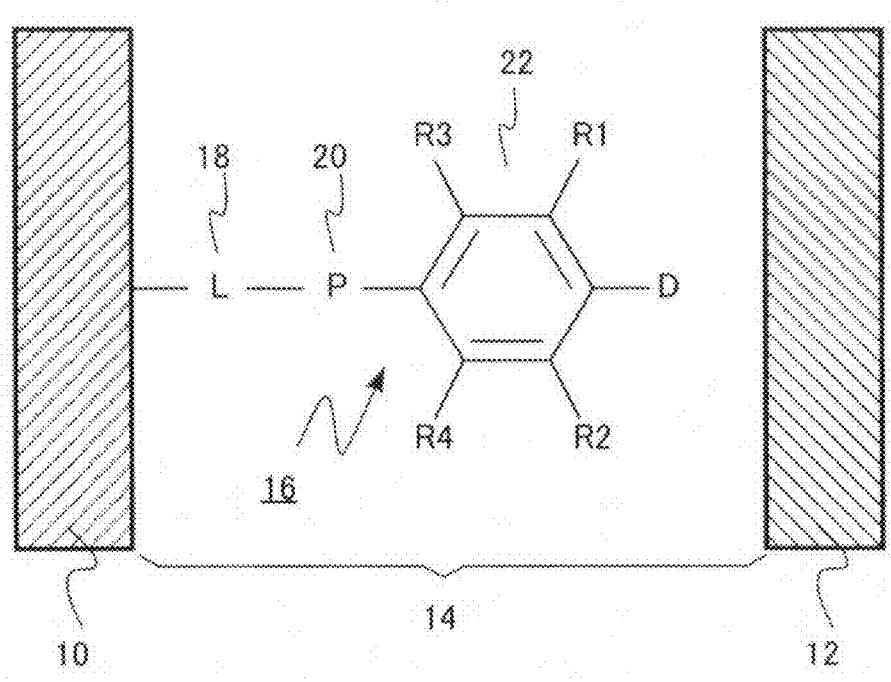
FIG. 17 is a schematic view showing a structure of a memory cell in a second embodiment.

FIG. 17 is a schematic view showing a structure of a memory cell in this embodiment. In this embodiment, as shown in FIG. 17, the substituent R0 shown in FIG. 2 is an electron-donating group (D).

An organic molecule 16 in this embodiment has a phenyl group 22 with an electron-donating group (D) unevenly distributed in the organic molecule 16, forming a π-D structure. This structure forms a potential due to a dipole in the organic molecule 16. This potential provides rectification to the organic molecule 16.

In this embodiment, a dipole moment from a π conjugated chain (P) 20 toward the electron-donating group (D) of the phenyl group 22 is developed. With this, with reference to a first conductive layer 10, rectification in which application of a negative voltage to a second conductive layer 12 is a forward bias is developed.

The substituent R0 of the phenyl group 22 in this embodiment is an electron-donating group (D). The electron-donating group (D) is, for example, an alkoxy group (—OR), a hydroxyl group (—OH), an amino group (—NH$_2$), an alkylamino group (—NHR), a dialkylamino group (—NR), or an amide group (—NHCOR).

Substituents R1, R2, R3, and R4 of the phenyl group 22 in this embodiment are each hydrogen, an electron-accepting group (A), or an electron-donating group (D). The electron-accepting group (A) is, for example, a nitro group (—NO$_2$), halogen (—F, —Cl, —Br, —I), a cyano group (—C≡N), a carbonyl group (—C(=O)=O)—), a sulfonyl group (—S(=O)$_2$—), or a trialkylamino group (—N+R$_3$). The electron-donating group (D) is an alkoxy group (—OR), a hydroxyl group (—OH), an amino group (—NH$_2$), an alkylamino group (—NHR), a dialkylamino group (—NR$_2$) or an amide group (—NHCOR).

At least one of the substituents R1, R2, R3, and R4 of the phenyl group 22 in this embodiment is preferably an electron-accepting group (A). This is because, since the substituent R0 is an electron-donating group (D), provision of an electron-accepting group (A) allows strengthening of the dipole moment, improving rectification. In particular, the substituents R3 and R4 are preferably electron-accepting groups (A), and the substituents R1 and R2, hydrogen.

The substituents R1, R2, R3, and R4 of the phenyl group 22 in this embodiment are preferably arranged in line symmetry with respect to the bonding direction of the π conjugated chain (P) 20. This is because the arrangement in line symmetry causes the direction of the dipole moment to be in parallel with an extending direction of the organic molecule 16, allowing the organic molecule 16 to effectively develop rectification.

The substituents R1, R2, R3, and R4 of the phenyl group 22 in this embodiment are preferably all hydrogen. This is because making the substituents R1, R2, R3, and R4 hydrogen increases the density of states (DOS) around the phenyl group 22.

The organic molecule 16 preferably has a dipole moment of 1.3 Debye ($=4.3\times10^{-30}$ C·m) or more to 15 Debye ($=50\times10^{-30}$ C·m) or less in the bonding direction. This is because, below 1.3 Debye, there is a possibility that sufficient rectification cannot be obtained. Over 15 Debye, the reset voltage of memory data becomes too high, making it difficult to reset memory data.

In this embodiment, since the substituent R0 is an electron-donating group (D), the direction of the dipole in the main chain direction of the molecule is from the first conductive layer 10 toward the second conductive layer 12. Thus, the work function of the first conductive layer 10 is preferably larger than the work function of the second conductive layer 12 in terms of improving rectification ($E_{F1}>E_{F2}$).

Third Embodiment

An organic molecular memory in this embodiment includes a first conducive layer, a second conductive layer, and an organic molecular layer provided between the first conductive layer and the second conductive layer, the organic molecular layer having an organic molecule, the organic molecule having a linker group bonded to the first conductive layer, a π conjugated chain bonded to the linker group, and a phenyl group bonded to the π conjugated chain opposite to the linker group, the π conjugated chain having single bonds and double bonds or triple bonds bonded alternately, a carbon number of the π conjugated chain being larger than twelve and not larger than forty six, then conjugated chain including electron-accepting groups or electron-donating groups arranged in line asymmetry with respect to a bonding direction of the π conjugated chain, the phenyl group having substituents R0, R1, R2, R3, and R4 as shown in the following formula, the substituent R0 being an aromatic ring, the aromatic ring facing the second conductive layer, at least one of the substituents R1, R2, R3, and R4 being an electron-accepting group or an electron-donating group.

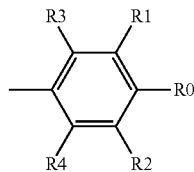

This embodiment is different from the first and second embodiments in that a substituent R0 of a phenyl group is not an electron-accepting group or an electron-donating group but an aromatic ring. Hereinafter, part of content overlapping that in the first and second embodiments will not be described.

Figure 18A:
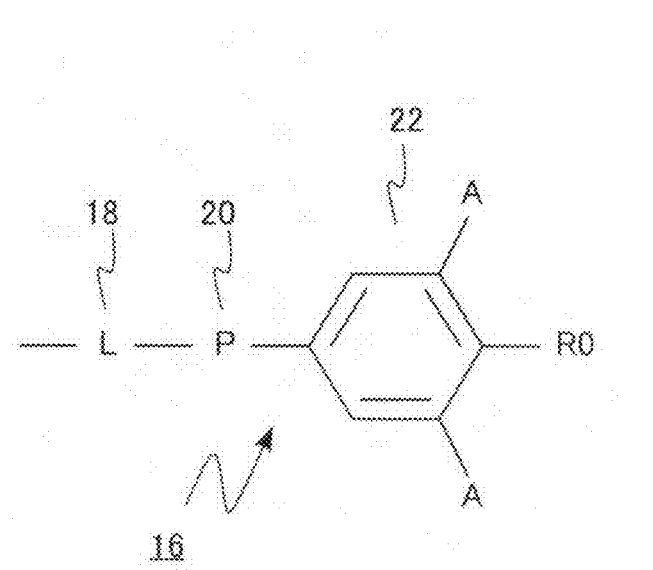
FIGS. 18A to 18C are schematic views showing a structure of an organic molecule in a third embodiment.
Figure 18B:
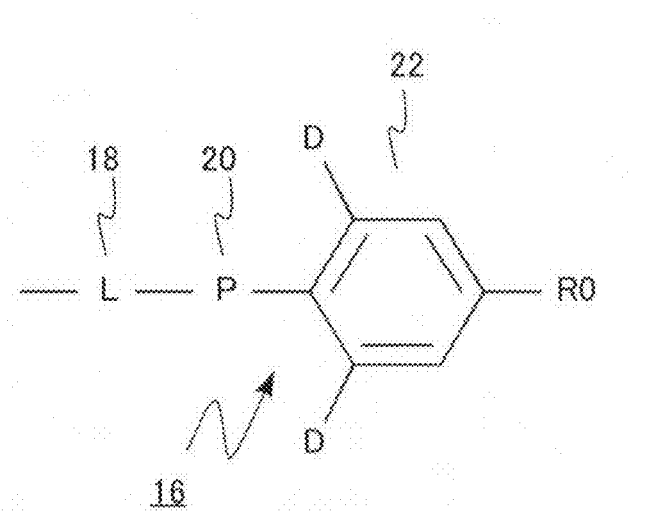
Figure 18C:
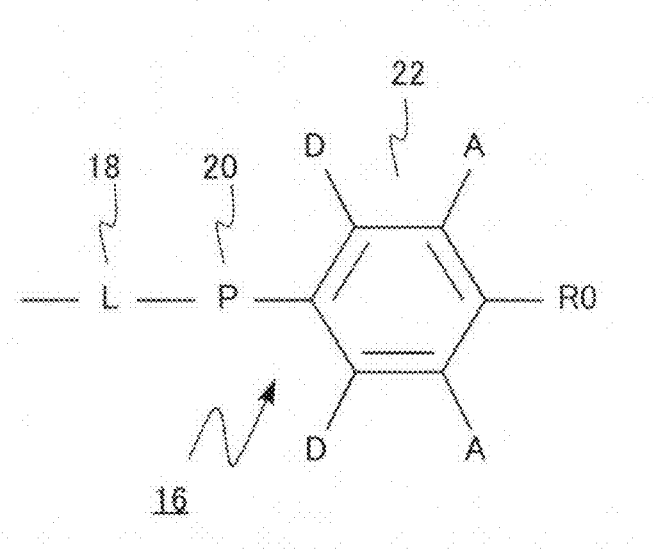

FIGS. 18A to 18C are diagrams exemplarily illustrating a structure of an organic molecule in this embodiment. In this embodiment, the substituent R0 of the phenyl group 22 is an aromatic ring (aromatic compound). The aromatic ring faces a second conductive layer 12. Provision of an aromatic ring with a high density of states (DOS) increases the ON/OFF ratio of a memory cell.

Figure 19A:
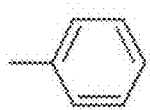
FIGS. 19A to 19D are diagrams exemplarily illustrating a structure of a substituent R0 in the third embodiment.
Figure 19C:
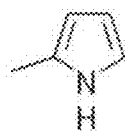
Figure 19B:
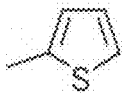
Figure 19D:
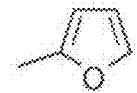

FIGS. 19A to 19D are diagrams exemplarily illustrating a structure of the substituent R0. The substituent R0 preferably includes a phenylene ring (FIG. 19A), a thiophene ring (FIG. 19B), a pyrrole ring (FIG. 19C), or a furan ring (FIG. 19D). In particular, it is preferably a phenylene ring (FIG. 19A).

At least one of substituents R1, R2, R3, and R4 of the phenyl group 22 in this embodiment is an electron-accepting group (A) or an electron-donating group (D). By providing an electron-accepting group (A) or an electron-donating group (D), a dipole moment in the bonding direction of the π conjugated chain (P) 20 is formed, developing the rectification.

The electron-accepting group (A) is, for example, a nitro group (—NO$_2$), halogen (—F, —Cl, —Br, —I), a cyano group (—C≡N), a carbonyl group (—C(=O)—), a sulfonyl group (—S(=O)$_2$—), or a trialkylamino group (—N+R$_3$). The electron-donating group (D) is an alkoxy group (—OR), a hydroxyl group (—OH), an amino group (—NH$_2$), an alkylamino group (—NHR), a dialkylamino group (—NR$_2$), or an amide group (—NHCOR).

In this embodiment, as shown in FIG. 18A, for example, the substituent R1 or R2 of the phenyl group 22 shown in FIG. 2 is an electron-accepting group (A). Alternatively, as shown in FIG. 18B, the substituent R3 or R4 of the phenyl group 22 shown in FIG. 2 is an electron-donating group (D). Alternatively, as shown in FIG. 18C, the substituent R1 or R2 of the phenyl group 22 shown in FIG. 2 may be an electron-accepting group (A) and the substituent R3 or R4 may be an electron-donating group (D).

These structures develop a dipole moment from the aromatic ring toward the π conjugated chain (P) 20 in the organic molecule 16. With this, with reference to a first conductive layer 10, rectification in which application of a positive voltage on a second conductive layer 12 is a forward bias is developed.

The substituents R1, R2, R3, and R4 of the phenyl group 22 in this embodiment are preferably arranged in line symmetry with respect to the bonding direction of the π conjugated chain (P) 20. This is because the arrangement in line symmetry causes the direction of a dipole moment to be in parallel with an extending direction of the organic molecule 16, allowing the organic molecule 16 to effectively develop rectification.

The organic molecule 16 preferably has a dipole moment of 1.3 Debye ($=4.3\times10^{-30}$ C·m) or more to 15 Debye ($=50\times10^{-30}$ C·m) or less in the bonding direction. This is because, below 1.3 Debye, there is a possibility that sufficient rectification cannot be obtained. Over 15 Debye, the reset voltage of memory data becomes too high, making it difficult to reset memory data.

Fourth Embodiment

This embodiment is different from the third embodiment in the arrangement of substituents R1, R2, R3, and R4 of a phenyl group. Hereinafter, part of content overlapping with that in the third embodiment will not be described.

Figure 20A:
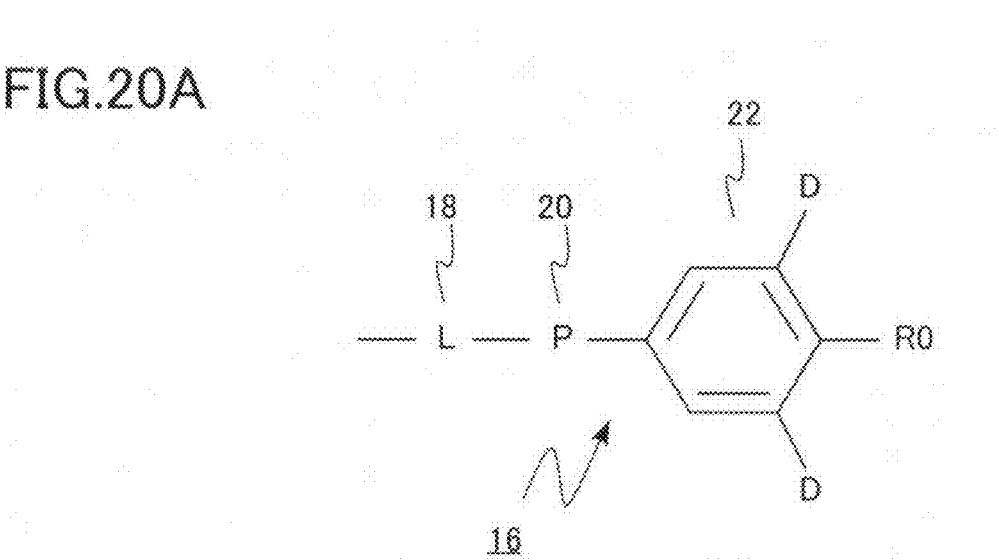
FIGS. 20A to 20C are diagrams exemplarily illustrating a structure of an organic molecule in a fourth embodiment.
Figure 20B:
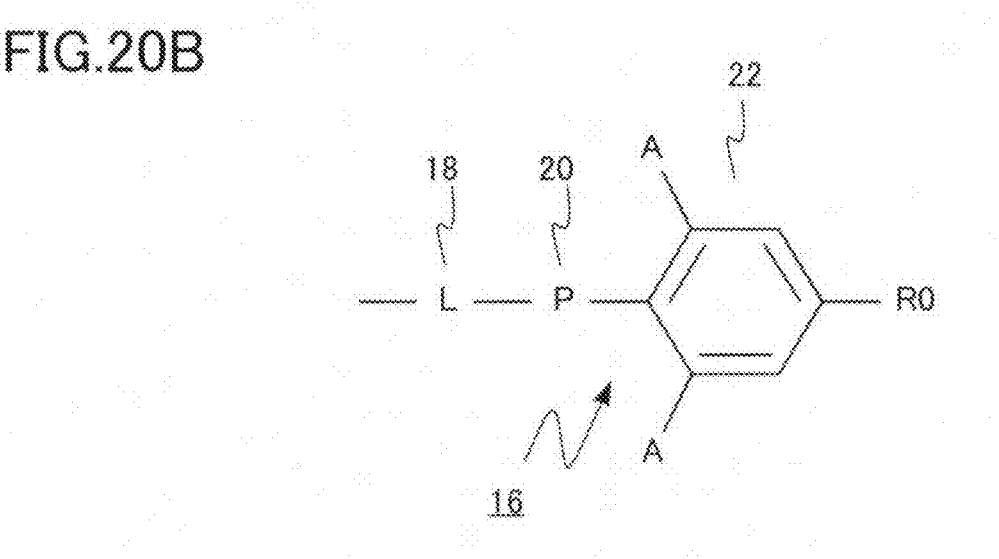
Figure 20C:
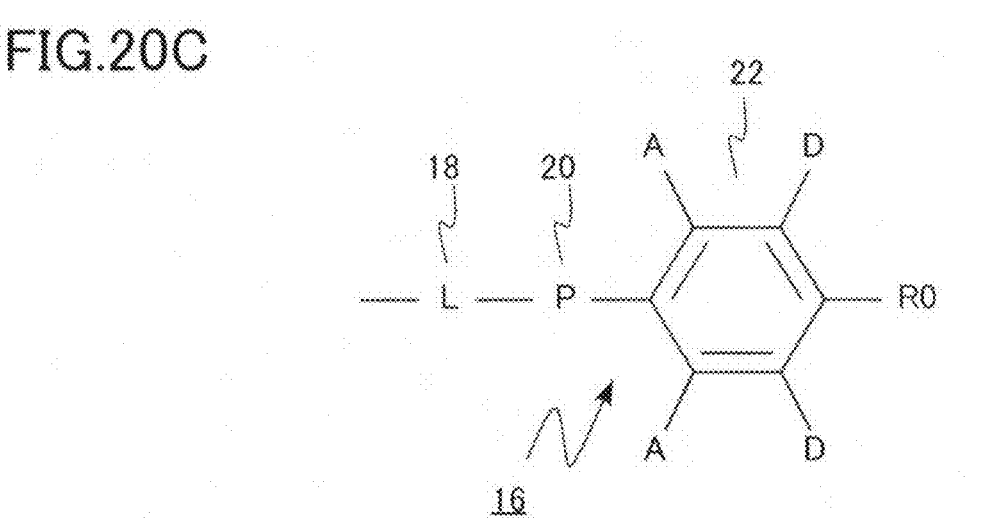

FIGS. 20A to 20C are diagrams exemplarily illustrating a structure of an organic molecule in this embodiment. In this embodiment, a substituent R0 of a phenyl group 22 is an aromatic ring (aromatic compound). By providing an aromatic ring with a high density of states (DOS), a high ON/OFF ratio can be provided.

At least one of the substituents R1, R2, R3, and R4 of the phenyl group 22 in this embodiment is an electron-accepting group (A) or an electron-donating group (D). By providing an electron-accepting group (A) or an electron-donating group (D), a dipole moment in the bonding direction of a π conjugated chain (P) 20 is developed, developing rectification.

The electron-accepting group (A) is, for example, a nitro group (—$NO_2$), halogen (—F, —Cl, —Br, —I), a cyano group (—C≡N), a carbonyl group (—C(=O)—), a sulfonyl group (—S(=O)$_2$—), or a trialkylamino group (—N+$R_3$). The electron-donating group (D) is an alkoxy group (—OR), a hydroxyl group (—OH), an amino group (—$NH_2$), an alkylamino group (—NHR), a dialkylamino group (—$NR_2$), or an amide group (—NHCOR).

In this embodiment, as shown in FIG. 20A, for example, the substituent R1 or R2 of the phenyl group 22 shown in FIG. 2 is an electron-donating group (D). Alternatively, as shown in FIG. 20B, the substituent R3 or R4 of the phenyl group 22 shown in FIG. 2 is an electron-accepting group (A). Alternatively, as shown in FIG. 20C, the substituent R1 or R2 of the phenyl group 22 shown in FIG. 2 may be an electron-donating group (D), and the substituent R3 or R4 may be an electron-accepting group (A).

These structures develop a dipole moment from the π conjugated chain (P) 20 toward the aromatic ring in the organic molecule 16. With this, with reference to a first conductive layer 10, rectification in which application of a negative voltage on a second conductive layer 12 is a forward bias is developed.

The substituents R1, R2, R3, and R4 of the phenyl group 22 in this embodiment are preferably arranged in line symmetry with respect to the bonding direction of the π conjugated chain (P) 20. This is because the arrangement in line symmetry causes the direction of a dipole moment to be in parallel with an extending direction of the organic molecule 16, allowing the organic molecule 16 to effectively develop rectification.

The organic molecule 16 preferably has a dipole moment of 1.3 Debye (=4.3×$10^{-30}$ C·m) or more to 15 Debye (=50× $10^{-30}$ C·m) or less in the bonding direction. This is because, below 1.3 Debye, there is a possibility that sufficient rectification cannot be obtained. Over 15 Debye, the reset voltage of memory data becomes too high, making it difficult to reset memory data.

EXAMPLES

Hereinafter, examples will be described.

Example 1

Figure 21A:
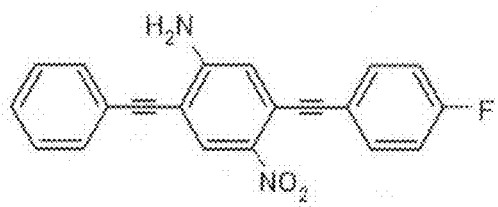
FIGS. 21A and 21B are diagrams illustrating a molecule in Example 1.
Figure 21B:
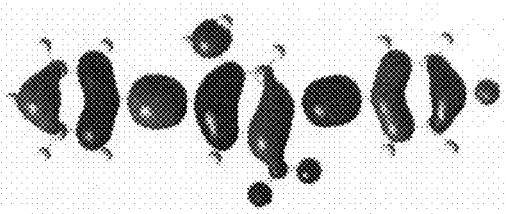

Example 1 is a specific example of an organic molecule in the first embodiment. FIGS. 21A and 21B are diagrams illustrating a molecule in Example 1. FIG. 21A shows a molecular structure, and FIG. 21B shows a HOMO. The dipole moment and the HOMO of the molecule were determined by calculation with Gaussian (DFT method: B3LYP is used, and the base function is 6-31G*).

A dipole the molecule has in a side chain direction is made from the vector sum of a dipole (α) of a nitro group with a magnitude of 4.22 (Debye) in a direction from a nitrogen atom to a carbon atom, and a dipole (β) of an amino group with a magnitude of 2.25 (Debye) in a direction from a carbon atom to a nitrogen atom. These dipoles contribute to a memory property. On the other hand, a dipole the molecule has in a main chain direction is a dipole (γ) with a magnitude of 1.41 (Debye) in a direction from a phenyl group to which fluorine is bonded to a phenyl group on the opposite side. This dipole contributes to a rectifying property.

The HOMO level of the molecule was 5.67 (eV), and η of the main chain π conjugated chain was 0.50. By the above-described image force method, potentials were calculated, resulting in $\Delta_1$=0.28 (eV) and $\Delta_2$=0.00 (eV).

Therefore, voltage at which current rises when an Au (111) substrate with the work function $E_F$=5.27 (eV) is used is, negative bias side $V_{th}^-$=−1.36 (V), and positive bias side $V_{th}^+$=0.80 (V). Rectification parameter ξ=0.63, which indicates excellent rectification.

Further, as shown in FIG. 21B, since the HOMO spreads throughout the molecule, the rate of tunneling from the second conductive layer to the molecule is not decreased by fluorine substitution of the substituent R0, and a high ON/OFF ratio can be maintained.

Here, fluorine used as an acceptor group is an example. When an acceptor group such as a nitro group, a halogen group such as chlorine or bromine, a cyano group, a carbonyl group, a sulfonyl group, or a trialkylamino group is used, a dipole moment is likewise formed in the main chain direction of the molecule, and the HOMO of the molecule has the density of states at the phenyl group and the acceptor group adjacent to the electrode. Thus the molecule can have a high rectification ratio and a high ON/OFF ratio.

Example 2

Figure 22A:
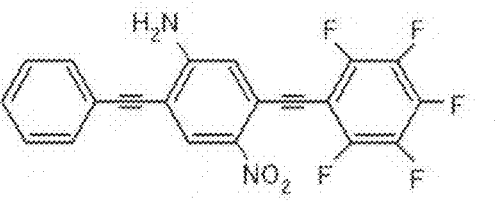
FIGS. 22A and 22B are diagrams illustrating a molecule in Example 2.
Figure 22B:
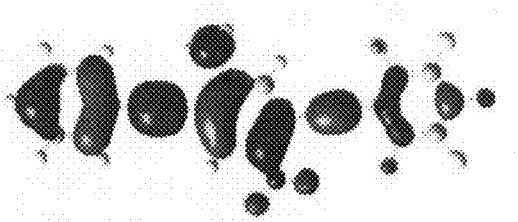

Example 2 is a specific example of an organic molecule in the first embodiment. FIGS. 22A and 22B are diagrams illustrating a molecule in Example 2. FIG. 22A shows a molecular structure, and FIG. 22B shows a HOMO.

By calculation with Gaussian (DFT method: B3LYP is used, and base function is 6-31G*), for dipoles of the molecule, there exist the vector sum of a dipole (α) of a nitro group with a magnitude of 4.22 (Debye) in a direction from a nitrogen atom to a carbon atom, and a dipole (β) of an amino group with a magnitude of 2.25 (Debye) in a direction from a carbon atom to a nitrogen atom, and a dipole (γ) with 3.16 (Debye) in a main chain direction from a phenyl group to which fluorine is bonded to a phenyl group on the opposite side.

The HOMO level of the molecule was 5.88 (eV), and η of the main chain π conjugated chain was 0.50. By the above-described image force method, potentials were calculated, resulting in Δ=0.42 (eV) and $\Delta_2$=0.00 (eV).

Therefore, voltage at which current rises when an Au (111) substrate with the work function $E_F$=5.27 (eV) is used is, negative bias side $V_{th}^-$=−2.06 (V), and positive bias side $V_{th}^+$=1.22 (V). Rectification parameter ξ=0.63, which indicates excellent rectification.

However, compared with Example 1, the HOMO does not spread throughout the molecule, and the rate of tunneling from the second conductive layer to the molecule is decreased, resulting in a reduced ON current. This is because the fluorine substitution of the substituents R1 to R4 causes a decrease in the density of states of the phenyl group.

Example 3

Figure 23A:
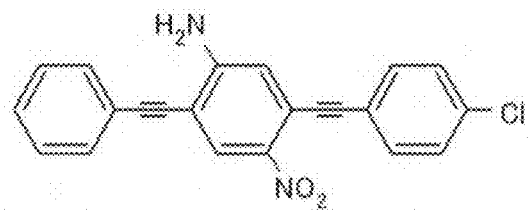
FIGS. 23A and 23B are diagrams illustrating a molecule in Example 3.
Figure 23B:
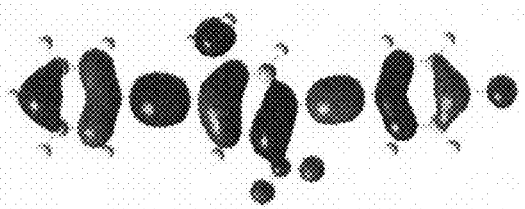

Example 3 is a specific example of an organic molecule in the first embodiment. FIGS. 23A and 23B are diagrams illustrating a molecule in Example 3. FIG. 23A shows a molecular structure, and FIG. 23B shows a HOMO. The dipole moment and the HOMO of the molecule were determined by calculation with Gaussian (DFT method: B3LYP is used, and the base function is 6-31G*).

A dipole the molecule has in a side chain direction is made from the vector sum of a dipole ($\alpha$) of a nitro group with a magnitude of 4.22 (Debye) in a direction from a nitrogen atom to a carbon atom, and a dipole ($\beta$) of an amino group with a magnitude of 2.25 (Debye) in a direction from a carbon atom to a nitrogen atom. These dipoles contribute to a memory property. On the other hand, a dipole the molecule has in a main chain direction is a dipole ($\gamma$) with a magnitude of 2.38 (Debye) in a direction from a phenyl group to which chlorine is bonded to a phenyl group on the opposite side. This dipole contributes to a rectifying property.

The HOMO level of the molecule was 5.74 (eV), and $\eta$ of the main chain $\pi$ conjugated chain was 0.50. By the above-described image force method, potentials were calculated, resulting in $\Delta_1$=0.36 (eV) and $\Delta_2$=0.00 (eV).

Therefore, voltage at which current rises when an Au (111) substrate with the work function $E_F$=5.27 (eV) is used is, negative bias side $V_{th}^-$=−1.66 (V), and positive bias side $V_{th}^+$=0.94 (V). Rectification parameter $\xi$=0.64, which indicates excellent rectification.

Further, as shown in FIG. 23B, since the HOMO spreads throughout the molecule, the rate of tunneling from the second conductive layer to the molecule is not decreased by the choline (Cl) substitution of the substituent R0, and a high ON/OFF ratio can be maintained.

Example 4

Figure 24A:
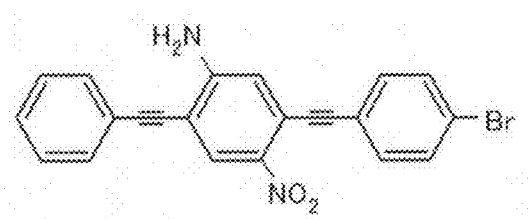
FIGS. 24A and 24B are diagrams illustrating a molecule in Example 4.
Figure 24B:
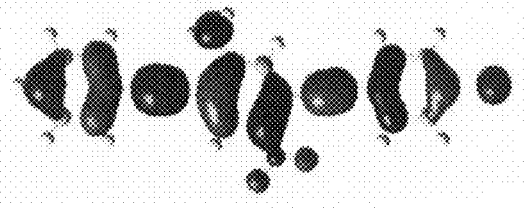

Example 4 is a specific example of an organic molecule in the first embodiment. FIGS. 24A and 24B are diagrams illustrating a molecule in Example 4. FIG. 24A shows a molecular structure, and FIG. 24B shows a HOMO. The dipole moment and the HOMO of the molecule were determined by calculation with Gaussian (DFT method: B3LYP is used, and the base function is 6-31G*).

A dipole the molecule has in a side chain direction is made from the vector sum of a dipole ($\alpha$) of a nitro group with a magnitude of 4.22 (Debye) in a direction from a nitrogen atom to a carbon atom, and a dipole (3) of an amino group with a magnitude of 2.25 (Debye) in a direction from a carbon atom to a nitrogen atom. These dipoles contribute to a memory property. On the other hand, a dipole the molecule has in a main chain direction is a dipole ($\gamma$) with a magnitude of 2.27 (Debye) in a direction from a phenyl group to which bromine is bonded to a phenyl group on the opposite side. This dipole contributes to a rectifying property.

The HOMO level of the molecule was 5.73 (eV), and $\eta$ of the main chain $\pi$ conjugated chain was 0.50. By the above-described image force method, potentials were calculated, resulting in $\Delta_1$=0.35 (eV) and $\Delta_2$=0.00 (eV).

Therefore, voltage at which current rises when an Au (111) substrate with the work function $E_F$=5.27 (eV) is used is, negative bias side $V_{th}^-$=−1.62 (V), and positive bias side $V_{th}^+$=0.92 (V). Rectification parameter $\xi$=0.64, which indicates excellent rectification.

Further, as shown in FIG. 24B, since the HOMO spreads throughout the molecule, the rate of tunneling from the second conductive layer to the molecule is not decreased by the bromine (Br) substitution of the substituent R0, and a high ON/OFF ratio can be maintained.

Example 5

Figure 25A:
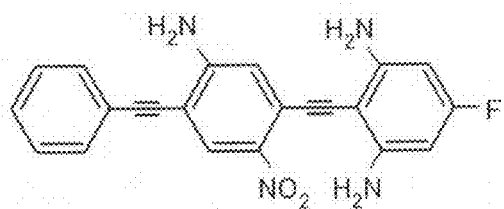
FIGS. 25A and 25B are diagrams illustrating a molecule in Example 5.
Figure 25B:
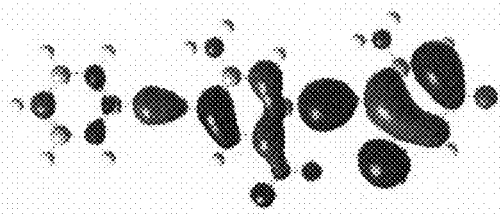

Example 5 is a specific example of an organic molecule in the first embodiment. FIGS. 25A and 25B are diagrams illustrating a molecule in Example 5. FIG. 25A shows a molecular structure, and FIG. 25B shows a HOMO. The dipole moment and the HOMO of the molecule were determined by calculation with Gaussian (DFT method: B3LYP is used, and the base function is 6-31G*).

A dipole the molecule has in a side chain direction is made from the vector sum of a dipole ($\alpha$) of a nitro group with a magnitude of 4.22 (Debye) in a direction from a nitrogen atom to a carbon atom, and a dipole ($\beta$) of an amino group with a magnitude of 2.25 (Debye) in a direction from a carbon atom to a nitrogen atom. These dipoles contribute to a memory property. On the other hand, a dipole the molecule has in a main chain direction is a dipole ($\gamma$) with a magnitude of 2.59 (Debye) in a direction from a phenyl group to which fluorine and amino groups are bonded to a phenyl group on the opposite side. This dipole contributes to a rectifying property.

The HOMO level of the molecule was 5.97 (eV), and $\eta$ of the main chain $\pi$ conjugated chain was 0.50. By the above-described image force method, potentials were calculated, resulting in $\Delta_1$=0.37 (eV) and $\Delta_2$=0.00 (eV).

Therefore, voltage at which current rises when an Au (111) substrate with the work function $E_F$=5.27 (eV) is used is, negative bias side $V_{th}^-$=−2.14 (V), and positive bias side $V_{th}^+$=1.40 (V). Rectification parameter $\xi$=0.60, which indicates excellent rectification.

Further, as shown in FIG. 25B, since the HOMO spreads throughout the phenyl group side substituted with fluorine and the amino groups, the rate of tunneling from the second conductive layer to the molecule is not decreased, and a high ON/OFF ratio can be maintained.

Comparative Example 1

Figure 26A:
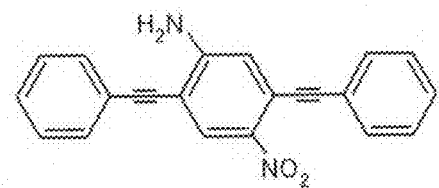
FIGS. 26A and 26B are diagrams illustrating a molecule in Comparative Example 1.
Figure 26B:
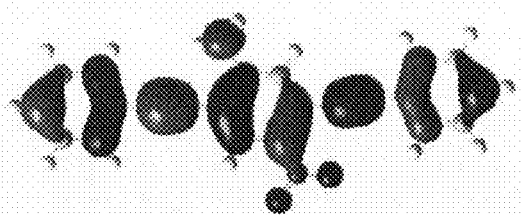

FIGS. 26A and 26B are diagrams illustrating a molecule in Comparative Example 1. FIG. 26A shows a molecular structure, and FIG. 26B shows a HOMO.

By calculation with Gaussian (DFT method: B3LYP is used, and the base function is 6-31G*), dipoles of the molecule are a dipole ($\alpha$) of a nitro group with a magnitude of 4.22 (Debye) in a direction from a nitrogen atom to a carbon atom, and a dipole ($\beta$) of an amino group with a magnitude of 2.25 (Debye) in a direction from a carbon atom to a nitrogen atom. A dipole moment $\gamma$ is small, and thus rectification is small.

The HOMO level of the molecule was 5.65 (eV), and $\eta$ of the main chain $\pi$ conjugated chain was 0.50. By the above-described image force method, potentials were calculated, resulting in $\Delta_1$=0.17 (eV) and $\Delta_2$=0.00 (eV).

Therefore, voltage at which current rises when an Au (111) substrate with the work function $E_F$=5.27 (eV) is used is, negative bias side $V_{th}^-$=−1.10 (V), and positive bias side $V_{th}^+$=0.76 (V). Rectification parameter $\xi$=0.59, which indicates weak rectification. However, since the difference in absolute value between $V_{th}^-$ and $V_{th}^+$ is 0.42 (V) or less, taking the broadening effect of the level due to heat into account, it cannot provide stable rectification (even allowing for variation in characteristics, rectification constantly develops), and may not be practical rectification.

In this Comparative Example, in order for the difference in absolute value between $V_{th}^-$ and $V_{th}^+$ to be 0.42 (V) or more, it is necessary that $\Delta_1 > 0.21$ (eV). When $\Delta_1 = 0.21$ (eV), voltage at which current rises is, negative bias side $V_{th}^- = -1.18$ (V), and positive bias side $V_{th}^+ = 0.76$ (V). In this case, rectification parameter $\xi = 0.6$.

Accordingly, in order to obtain stable rectification even allowing for variation, when the positive bias side is a forward direction, it is desirable that rectification parameter $\xi > 0.6$. Likewise, when the negative bias side is a forward direction, it is desirable that rectification parameter $\xi < 0.4$.

On the other hand, as shown in FIG. 26B, since the HOMO spreads throughout the molecule, the rate of tunneling from the second conductive layer to the molecule is not decreased, and a high ON/OFF ratio can be maintained.

Comparative Example 2

Figure 27A:
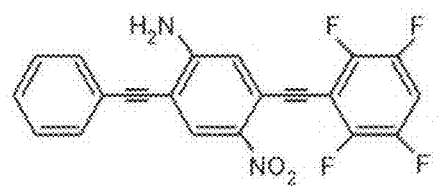
FIGS. 27A and 27B are diagrams illustrating a molecule in Comparative Example 2.
Figure 27B:
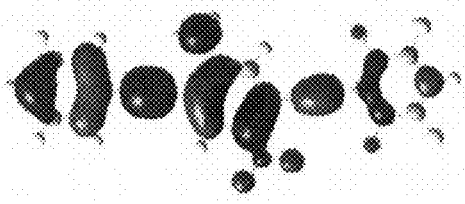

FIGS. 27A and 27B are diagrams illustrating a molecule in Comparative Example 2. FIG. 27A shows a molecular structure, and FIG. 27B shows a HOMO.

By calculation with Gaussian (DFT method: B3LYP is used, and the base function is 6-31G*), for dipoles of the molecular, there exist the vector sum of a dipole ($\alpha$) of a nitro group with a magnitude of 4.22 (Debye) in a direction from a nitrogen atom to a carbon atom, and a dipole ($\beta$) of an amino group with a magnitude of 2.25 (Debye) in a direction from a carbon atom to a nitrogen atom, and a dipole ($\gamma$) with a magnitude of 1.90 (Debye) in a main chain direction from a phenyl group to which fluorine is bonded to a phenyl group on the opposite side.

The HOMO level of the molecule was 5.86 (eV), and $\eta$ of the main chain $\pi$ conjugated chain was 0.50. By the above-described image force method, potentials were calculated, resulting in $\Delta_1 = 0.32$ (eV) and $\Delta_2 = 0.00$ (eV).

Therefore, voltage at which current rises when an Au (111) substrate with the work function $E_F = 5.27$ (eV) is used is, negative bias side $V_{th}^- = -1.82$ (V), and positive bias side $V_{th}^+ = 1.18$ (V). Rectification parameter $\xi = 0.61$, which indicates excellent rectification.

However, as shown in FIG. 27B, the HOMO does not spread throughout the molecule, and the rate of tunneling from the second conductive layer to the molecule is decreased, resulting in a decreased ON current. This is because the fluorine substitution of the substituents R1 to R4 causes a decrease in the density of states of the phenyl group.

Comparative Example 3

Figure 28A:
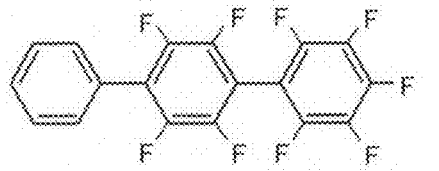
FIGS. 28A and 28B are diagrams illustrating a molecule in Comparative Example 3.
Figure 28B:
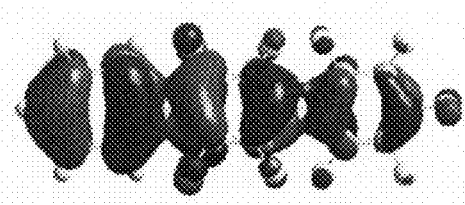

FIGS. 28A and 28B are diagrams illustrating a molecule in Comparative Example 3. FIG. 28A shows a molecular structure, and FIG. 28B shows a HOMO.

By calculation with Gaussian (DFT method: B3LYP is used, and the base function is 6-31G*), for a dipole of the molecule, there exists a dipole ($\gamma$) with 2.39 (Debye) in a main chain direction from a phenyl group to which fluorine is bonded to a phenyl group on the opposite side.

Although this dipole provides rectification in IV characteristics, hysteresis behavior is not observed because there is no substituent contributing to the electron-lattice interaction in a $\pi$ conjugated main chain (P). Therefore, the molecule does not have a memory property.

Example 6

Figure 29A:
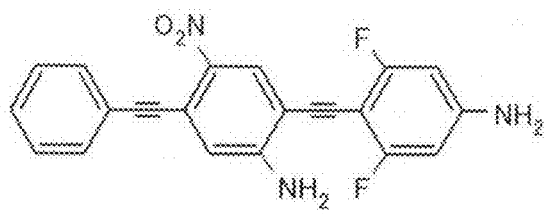
FIGS. 29A and 29B are diagrams illustrating a molecule in Example 6.
Figure 29B:
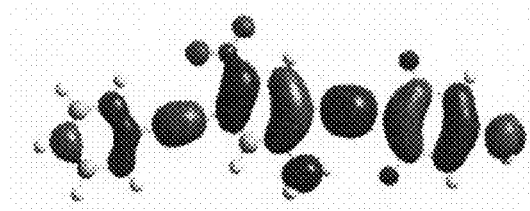

Example 6 is a specific example of an organic molecule in the second embodiment. FIGS. 29A and 29B are diagrams illustrating a molecule in Example 6. FIG. 29A shows a molecular structure, and FIG. 29B shows a HOMO. The dipole moment and the HOMO of the molecule were determined by calculation with Gaussian (DFT method: B3LYP is used, and the base function is 6-31G*).

A dipole the molecule has in a side chain direction is made from the vector sum of a dipole ($\alpha$) of a nitro group with a magnitude of 4.22 (Debye) in a direction from a nitrogen atom to a carbon atom, and a dipole ($\beta$) of an amino group with a magnitude of 2.25 (Debye) in a direction from a carbon atom to a nitrogen atom. These dipoles contribute to a memory property. On the other hand, a dipole the molecule has in a main chain direction is a dipole ($\gamma$) with a magnitude of 3.74 (Debye) in a direction from a phenyl group with no substituent to a phenyl group to which an amino group and fluorine groups are bonded. This dipole contributes to a rectifying property.

The HOMO level of the molecule was 5.38 (eV), and $\eta$ of the main chain $\pi$ conjugated chain was 0.50. By the above-described image force method, potentials were calculated, resulting in $\Delta = 0.00$ (eV) and $\Delta_2 = 0.57$ (eV).

Therefore, voltage at which current rises when an Au (111) substrate with the work function $E_F = 5.27$ (eV) is used is, negative bias side $V_{th}^- = -0.22$ (V), and positive bias side $V_{th}^+ = 1.36$ (V). Rectification parameter $\xi = 0.14$, which indicates excellent rectification.

Further, as shown in FIG. 29B, since the HOMO spreads throughout the molecule, a high ON/OFF ratio can be maintained.

Here, an amino group used as a donor group is an example. When a donor group such as an alkoxy group, a hydroxyl group, an amino group, an alkylamino group, a dialkylamino group, or an amide group is used, a dipole moment is likewise formed in a main chain direction of the molecule. The HOMO of the molecule spreads throughout the molecule, and thus the molecule can have a high rectification ratio and a high ON/OFF ratio.

Example 7

Figure 30A:
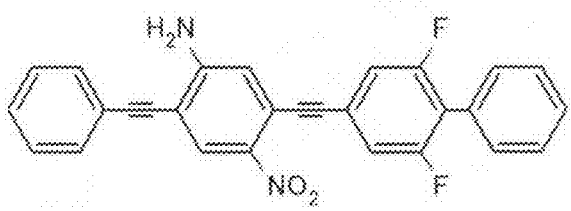
FIGS. 30A and 30B are diagrams illustrating a molecule in Example 7.
Figure 30B:
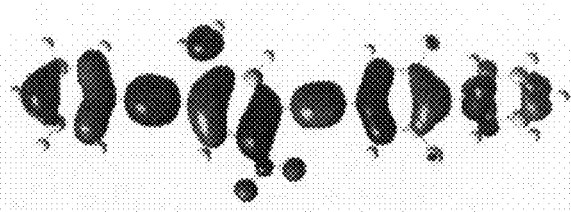

Example 7 is a specific example of an organic molecule in the third embodiment. FIGS. 30A and 30B are diagrams illustrating a molecule in Example 7. FIG. 30A shows a molecular structure, and FIG. 30B shows a HOMO. The dipole moment and the HOMO of the molecule were determined by calculation with Gaussian (DFT method: B3LYP is used, and the base function is 6-31G*).

A dipole the molecule has in a side chain direction is made from the vector sum of a dipole ($\alpha$) of a nitro group with a magnitude of 4.22 (Debye) in a direction from a nitrogen atom to a carbon atom, and a dipole ($\beta$) of an amino group with a magnitude of 2.25 (Debye) in a direction from a carbon atom to a nitrogen atom. These dipoles contribute to a memory property. On the other hand, a dipole the molecule has in a main chain direction is a dipole ($\gamma$) with a magnitude of 1.79 (Debye) in a direction from a phenyl group to which fluorine is bonded to a phenyl group on the opposite side. This dipole contributes to a rectifying property.

The HOMO level of the molecule was 5.74 (eV), and $\eta$ of the main chain $\pi$ conjugated chain was 0.50. By the above-described image force method, potentials were calculated, resulting in $\Delta_1 = 0.30$ (eV) and $\Delta_2 = 0.00$ (eV).

Therefore, voltage at which current rises when an Au (111) substrate with the work function $E_F$=5.27 (eV) is used is, negative bias side $V_{th}^-$=−1.54 (V), and positive bias side $V_{th}^+$=0.94 (V). Rectification parameter ξ=0.62, which indicates excellent rectification.

Further, the phenyl group having conductivity adjacent to the second conductive layer prevents a decrease in the rate of tunneling from the second conductive layer to the molecule, allowing a high ON/OFF ratio to be maintained.

Here, fluorine used as an acceptor is an example. When an acceptor group such as a nitro group, a halogen group such as chlorine or bromine, a cyano group, a carbonyl group, a sulfonyl group, or a trialkylamino group is used, a dipole moment is likewise formed in a main chain direction of a molecule, and the HOMO of the molecule has the density of states at a phenyl group and an acceptor group adjacent to an electrode. Thus the molecule can have a high rectification ratio and a high ON/OFF ratio.

Example 8

Figure 31A:
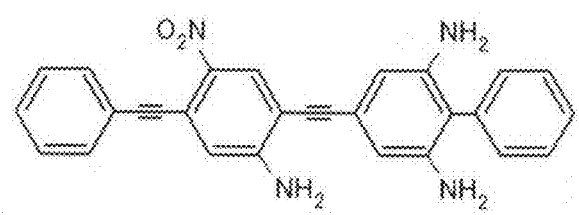
FIGS. 31A and 31B are diagrams illustrating a molecule in Example 8.
Figure 31B:
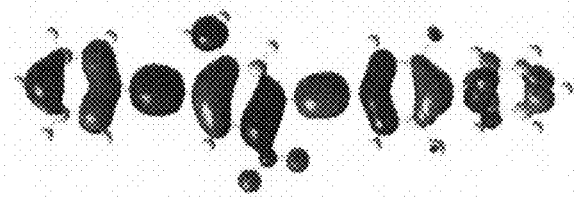

Example 8 is a specific example of an organic molecule in the fourth embodiment. FIGS. 31A and 31B are diagrams illustrating a molecule in Example 8. FIG. 31A shows a molecular structure, and FIG. 31B shows a HOMO. The dipole moment and the HOMO of the molecule were determined by calculation with Gaussian (DFT method: B3LYP is used, and the base function is 6-31G*).

A dipole the molecule has in a side chain direction is made from the vector sum of a dipole (α) of a nitro group with a magnitude of 4.22 (Debye) in a direction from a nitrogen atom to a carbon atom, and a dipole (β) of an amino group with a magnitude of 2.25 (Debye) in a direction from a carbon atom to a nitrogen atom. These dipoles contribute to a memory property. On the other hand, a dipole the molecule has in a main chain direction is a dipole (γ) with a magnitude of 2.92 (Debye) in a direction from a phenyl group with no substituent to a phenyl group to which amino groups are bonded. This dipole contributes to a rectifying property.

The HOMO level of the molecule was 5.37 (eV), and η of the main chain π conjugated chain was 0.50. By the above-described image force method, potentials were calculated, resulting in $\Delta_1$=0.00 (eV) and $\Delta_2$=0.14 (eV).

Therefore, voltage at which current rises when an Au (111) substrate with the work function $E_F$=5.27 (eV) is used is, negative bias side $V_{th}^-$=−0.20 (V), and positive bias side $V_{th}^+$=0.48 (V). Rectification parameter ξ=0.29, which indicates excellent rectification.

Further, as shown in FIG. 31B, since the HOMO spreads throughout the molecule, a high ON/OFF ratio can be maintained.

Here, the amino groups used as donor groups are an example. When a donor group such as an alkoxy group, a hydroxyl group, an amino group, an alkylamino group, a dialkylamino group, or an amide group is used, a dipole moment is likewise formed in a main chain direction of the molecule. The HOMO of the molecule spreads throughout the molecule, and thus the molecule can have a high rectification ratio and a high ON/OFF ratio.

The third and fourth embodiments have been described with the examples in which the substituent R0 of the phenyl group 22 is an aromatic ring. In place of an aromatic ring, a vinylene group or an ethynylene group can be used to provide an organic molecular memory including an organic molecule that has a rectifying property and allows an increase in the ON/OFF ratio.

While certain embodiments have been described, these embodiments have been presented by way of example only, and are not intended to limit the scope of the inventions. Indeed, an organic molecular memory described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. An organic molecular memory, comprising:
    a first conducive layer;
    a second conductive layer; and
    an organic molecular layer provided between the first conductive layer and the second conductive layer, the organic molecular layer having an organic molecule, the organic molecule having a linker group bonded to the first conductive layer, a π conjugated chain bonded to the linker group, and a phenyl group bonded to the π conjugated chain opposite to the linker group and facing the second conductive layer, the π conjugated chain having single bonds and double bonds or triple bonds bonded alternately, a carbon number of the π conjugated chain being larger than twelve and not larger than forty six, the π conjugated chain including electron-accepting groups or electron-donating groups arranged in line asymmetry with respect to a bonding direction of the π conjugated chain, the phenyl group having substituents R0, R1, R2, R3, and R4 as shown in the following formula, the substituent R0 being an electron-accepting group or an electron-donating group

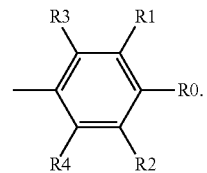

2. The organic molecular memory according to claim 1, wherein the substituents R1, R2, R3, and R4 are arranged in line symmetry with respect to the bonding direction.

3. The organic molecular memory according to claim 1, wherein when the substituent R0 is the electron-accepting group, the substituents R1, R2, R3, and R4 are hydrogen or electron-donating groups, and when the substituent R0 is the electron-donating group, the substituents R1, R2, R3, and R4 are hydrogen or electron-accepting groups.

4. The organic molecular memory according to claim 1, wherein the substituent R0 is a nitro group, halogen, a cyano group, a carbonyl group, a sulfonyl group, or a trialkylamino group.

5. The organic molecular memory according to claim 1, wherein the substituent R0 is an alkoxy group, a hydroxyl group, an amino group, an alkylamino group, a dialkylamino group, or an amide group.

6. The organic molecular memory according to claim 1, wherein the substituents R1, R2, R3, and R4 are all hydrogen.

7. The organic molecular memory according to claim 1, wherein at least any one of the substituents R1, R2, R3, and R4 is a nitro group, halogen, a cyano group, a carbonyl group, a sulfonyl group, or a trialkylamino group.

8. The organic molecular memory according to claim 1, wherein at least any one of the substituents R1, R2, R3, and R4 is an alkoxy group, a hydroxyl group, an amino group, an alkylamino group, a dialkylamino group, or an amide group.

9. The organic molecular memory according to claim 1, wherein the π conjugated chain includes a phenylene ring, a thiophene ring, a pyrrole ring, a furan ring, a vinylene group, or an ethynylene group.

10. The organic molecular memory according to claim 1, wherein the first conductive layer and the second conductive layer are formed of different materials.

11. The organic molecular memory according to claim 1, wherein one of the first conductive layer and the second conductive layer includes Au, Ag, Cu, Pt, Pd, Fe, W, or $WN_2$, and the other includes Ta, TaN, Mo, MoN, or TiN.

12. The organic molecular memory according to claim 1, wherein when the substituent R0 is the electron-accepting group, a work function of the second conductive layer is larger than a work function of the first conducive layer.

13. The organic molecular memory according to claim 1, wherein when the substituent R0 is the electron-donating group, a work function of the first conductive layer is larger than a work function of the second conducive layer.

14. The organic molecular memory according to claim 1, wherein the linker group is a thiol group, a silanol group, an alcohol group, a phosphonic acid group, a carboxyl group, or an azo group.

15. The organic molecular memory according to claim 1, wherein the organic molecule has a dipole moment of 1.3 Debye or more to 15 Debye or less in the bonding direction.

16. An organic molecular memory, comprising:
a first conducive layer;
a second conducive layer; and
an organic molecular layer provided between the first conductive layer and the second conductive layer, the organic molecular layer having an organic molecule, the organic molecule having a linker group bonded to the first conductive layer, a π conjugated chain bonded to the linker group, and a phenyl group bonded to the π conjugated chain opposite to the linker group, the π conjugated chain having single bonds and double bonds or triple bonds bonded alternately, a carbon number of the π conjugated chain being larger than twelve and not larger than forty six, the π conjugated chain including electron-accepting groups or electron-donating groups arranged in line asymmetry with respect to a bonding direction of the π conjugated chain, the phenyl group having substituents R0, R1, R2, R3, and R4 as shown in the following formula, the substituent R0 being an aromatic ring, the aromatic ring facing the second conductive layer, at least one of the substituents R1, R2, R3, and R4 being an electron-accepting group or an electron-donating group

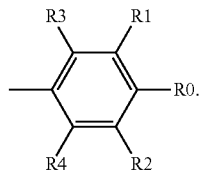

17. The organic molecular memory according to claim 16, wherein the substituents R1, R2, R3, and R4 are arranged in line symmetry with respect to the bonding direction.

18. The organic molecular memory according to claim 16, wherein the aromatic ring is a phenyl ring, a thiophene ring, a pyrrole ring, or a furan ring.

19. The organic molecular memory according to claim 16, wherein at least one of the substituents R1, R2, R3, and R4 is a nitro group, halogen, a cyano group, a carbonyl group, a sulfonyl group, or a trialkylamino group.

20. The organic molecular memory according to claim 16, wherein at least one of the substituents R1, R2, R3, and R4 is an alkoxy group, a hydroxyl group, an amino group, an alkylamino group, a dialkylamino group, or an amide group.

* * * * *